United States Patent
Wang et al.

(10) Patent No.: US 10,608,313 B2
(45) Date of Patent: Mar. 31, 2020

(54) WILKINSON COMBINER WITH COUPLED INDUCTORS

(71) Applicant: Linear Technology Holding LLC, Norwood, MA (US)

(72) Inventors: Xudong Wang, Colorado Springs, CO (US); William B. Beckwith, Monument, CO (US); Michael W. Bagwell, Colorado Springs, CO (US)

(73) Assignee: Linear Technology Holding LLC, Norwood, MA (US)

( * ) Notice: Subject to any disclaimer, the term of this patent is extended or adjusted under 35 U.S.C. 154(b) by 66 days.

(21) Appl. No.: 15/865,178

(22) Filed: Jan. 8, 2018

(65) Prior Publication Data

US 2019/0214700 A1 Jul. 11, 2019

(51) Int. Cl.
*H01P 5/16* (2006.01)
*H03H 7/09* (2006.01)
(Continued)

(52) U.S. Cl.
CPC .................. *H01P 5/16* (2013.01); *H01P 1/36* (2013.01); *H03H 7/09* (2013.01); *H03H 7/38* (2013.01); *H03H 7/48* (2013.01); *H01P 7/082* (2013.01)

(58) Field of Classification Search
CPC ................ H03H 7/38; H01P 5/16; H01P 1/36
See application file for complete search history.

(56) References Cited

U.S. PATENT DOCUMENTS

| 519,346 A | 5/1894 | Pupin |
| 2,783,438 A | 2/1957 | Perkins |

(Continued)

FOREIGN PATENT DOCUMENTS

| DE | 202019000042 U1 | 5/2019 |
| JP | S5228839 B1 | 7/1977 |

(Continued)

OTHER PUBLICATIONS

Amin et al., "High Power Combiner/Divider Design for Dual Band RF Power Amplifiers," Proceedings of the 2015 International Conference on Electromagnetics in Advanced Applications, 2015, pp. 1036-1039.

(Continued)

*Primary Examiner* — Robert J Pascal
*Assistant Examiner* — Kimberly E Glenn
(74) *Attorney, Agent, or Firm* — Schwegman Lundberg & Woessner, P.A.

(57) ABSTRACT

A power divider/combiner circuit with coupled inductors is provided. With coupled inductors, the new circuit topology exhibits broader bandwidth for insertion loss, port matching and isolation compared with traditional power divider/combiner circuit topologies. The coupled inductors can be implemented for single-stage low-pass networks, multi-stage low-pass networks, or multi-stage wide-band networks. For example, the power divider/combiner circuit includes a first coupled inductor circuit coupled to an input terminal that provides a first signal path to a first output terminal, and a second coupled inductor circuit coupled to the input terminal that provides a second signal path to a second output terminal. Each of the coupled inductor circuits include multiple inductors that are tightly and positively magnetically coupled to one another. Each of the coupled inductor circuits provides an output signal that is based on a transfer function that includes a coupling coefficient of the corresponding coupled inductor circuit.

20 Claims, 18 Drawing Sheets

(51) Int. Cl.
　　　*H03H 7/48*　　　(2006.01)
　　　*H01P 1/36*　　　(2006.01)
　　　*H03H 7/38*　　　(2006.01)
　　　*H01P 7/08*　　　(2006.01)

(56) References Cited

U.S. PATENT DOCUMENTS

| | | | |
|---|---|---|---|
| 3,436,687 | A | 4/1969 | Andrews et al. |
| 3,718,873 | A | 2/1973 | Garver |
| 4,063,201 | A | 12/1977 | Komatsubara et al. |
| 4,837,532 | A | 6/1989 | Lang |
| 4,885,562 | A | 12/1989 | Ouvrard et al. |
| 4,994,773 | A | 2/1991 | Chen et al. |
| 5,148,130 | A | 9/1992 | Dietrich |
| 5,339,462 | A | 8/1994 | Staudinger et al. |
| 5,430,418 | A | 7/1995 | Blodgett |
| 5,777,532 | A | 7/1998 | Lakin |
| 5,973,567 | A | 10/1999 | Heal et al. |
| 6,052,039 | A | 4/2000 | Chiou et al. |
| 6,900,695 | B2 | 5/2005 | Ouacha |
| 6,950,590 | B2 | 9/2005 | Cheung et al. |
| 7,170,353 | B2 | 1/2007 | Amano |
| 7,239,218 | B2 | 7/2007 | Nakamura |
| 7,446,712 | B2 | 11/2008 | Itoh et al. |
| 7,459,995 | B2 | 12/2008 | Suzuki |
| 7,602,240 | B2 | 10/2009 | Gao et al. |
| 7,719,386 | B2 | 5/2010 | Atsumo et al. |
| 7,928,817 | B2 | 4/2011 | Atsumo |
| 8,264,300 | B2 | 9/2012 | Cisco |
| 8,350,642 | B2 | 1/2013 | Jensen |
| 8,410,863 | B2 | 4/2013 | Satou et al. |
| 9,059,679 | B2 | 6/2015 | Edelstein et al. |
| 9,853,340 | B2 | 12/2017 | Leipold et al. |
| 10,116,281 | B2 * | 10/2018 | Lee .......................... H03H 7/46 |

FOREIGN PATENT DOCUMENTS

| | | |
|---|---|---|
| JP | H 08-288711 A | 11/1996 |
| JP | 2001-016062 A | 1/2001 |
| JP | 2001-016063 A | 1/2001 |
| JP | 2009-253491 A | 10/2009 |
| JP | 4400557 B2 | 11/2009 |
| KR | 101688899 B1 | 12/2016 |
| WO | WO-2012/060775 A1 | 5/2012 |

OTHER PUBLICATIONS

Lu et al., "A Miniaturized Wilkinson Power Divider with CMOS Active Inductors," IEEE Microwave and Wireless Components Letters, Nov. 2005, vol. 15, No. 11, pp. 775-777.

Olvera-Cervantes et al., "A Wideband Quadrature Power Divider/ Combiner and its Application to an Improved Balanced Amplifier," Progress in Electromagnetics Research C, 2013, vol. 34, pp. 29-39.

Osman et al., "Analysis and Design of UWB Modified Two-Sections Wilkinson Power Splitter," 16th International Conference on Aerospace Sciences and Aviation Technology, May 2015, Paper: ASAT-16-157-CM, 14 pages.

Raab et al., "RF and Mircowave Power Amplifier and Transmitter Technlogies—Part 3," High Frequency Electronics, Sep. 2003, pp. 34-48.

"Chinese Application Serial No. 201920004023.8, Office Action dated Jun. 25, 2019", W/English Translation, 2 pgs.

Caloz, et al., "A Novel Composite Right-/Left-Handed Coupled-Line Directional Coupler With Arbitrary Coupling Level and Broad Bandwidth", IEEE Transactions on Microwave Theory and Techniques, vol. 52, No. 3, (Mar. 2004), 13 pgs.

Camacho-Penalosa, C., et al., "Derivation and General Properties of Artificial Lossless Balanced Composite Right/Left-Handed Transmission Lines of Arbitrary Order", Progress in Electromagnetics Research B, vol. 13, (2009), 19 pgs.

De Astis, Giuseppe, et al., "A 5-GHz Fully Integrated Full PMOS Low-Phase-Noise LC VCO", IEEE Journal of Solid-State Circuits, vol. 40, No. 10, (Oct. 2005), 6 pgs.

Duran-Sindreu, Miguel, et al., "Composite Right-/Left-Handed Transmission Line Metamaterials", Wiley Encyclopedia of Electrical and Electronics Engineering, (2013), 25 pgs.

Entesari, Kamran, et al., "CMOS Distributed Amplifiers with Extended Flat Bandwidth and Improved Input Matching using Gate Line with Coupled Inductors", IEEE Transactions on Microwave Theory and Techniques, vol. 57, No. 12, (Dec. 2009), 10 pgs.

Kuo, Tsung-Nan, et al., "A Compact LTCC Branch-Line Coupler Using Modified-T Equivalent-Circuit Model for Transmission Line", IEEE Microwave and Wireless Components Letters, vol. 16, No. 2, (Feb. 2006), 3 pgs.

Larocca, Tim, et al., "Millimeter-Wave CMOS Digital Controlled Artificial Dielectric Differential Mode Transmission Lines for Reconfigurable ICs", IEEE MTT-S Intl. Microwave Symposium Digest, Atlanta, GA, USA, (Jun. 2008), 4 pgs.

Lin, Yo-Shen, et al., "Design of an LTCC Tri-Band Transceiver Module for GPRS Mobile Applications", IEEE Transactions on Microwave Theory and Techniques, vol. 52, No. 12, (Dec. 2004), 7 pgs.

Liu, Xuan-Hong, et al., "Super Compact and Ultrabroadband Power Divider Using Silicon-Based Integrated Passive Device Technology", IEEE Transactions on Components, Packaging and Manufacturing Technology, vol. 6, No. 12, (Dec. 2016), 10 pgs.

Phinney, Joshua W., et al., "Synthesis of Lumped Transmission-Line Analogs", IEEE Transactions on Power Electronics, vol. 22, No. 4, (Jul. 2007), 12 pgs.

Ross, Bob, "T-Coils and Bridged-T Networks", European IBIS Summit, Naples, Italy; Teraspeed Consulting Group LLC, (Sep. 2007), 24 pgs.

Sanchez-Martinez, J.J., et al., "Artificial Transmission Line with Left/Right-Handed Behavior Based on Wire Bonded Interdigital Capacitors", Progress in Electromagnetics Research B, vol. 11, (2009), 20 pgs.

Song, Pingyue, et al., "Wideband mm-Wave Phase Shifters Based on Constant-Impedance Tunable Transmission Lines", IEEE MTT-S Intl. Microwave Symposium (IMS), San Francisco, CA, USA, (May 2016), 4 pgs.

Wang, Youzhen, et al., "Coupling Characteristics between Composite Right-/Left-Handed Transmission Line and Conventional Transmission Line", Intl. Conference on Microwave and Millimeter Wave Technology, Nanjing, China, (Apr. 2008), 4 pgs.

Woods, Wayne H., et al., "CMOS Millimeter Wave Phase Shifter Based on Tunable Transmission Lines", Proc. of the IEEE Custom Integrated Circuits Conference, San Jose, CA, USA, Sep. 2013), 4 pgs.

* cited by examiner

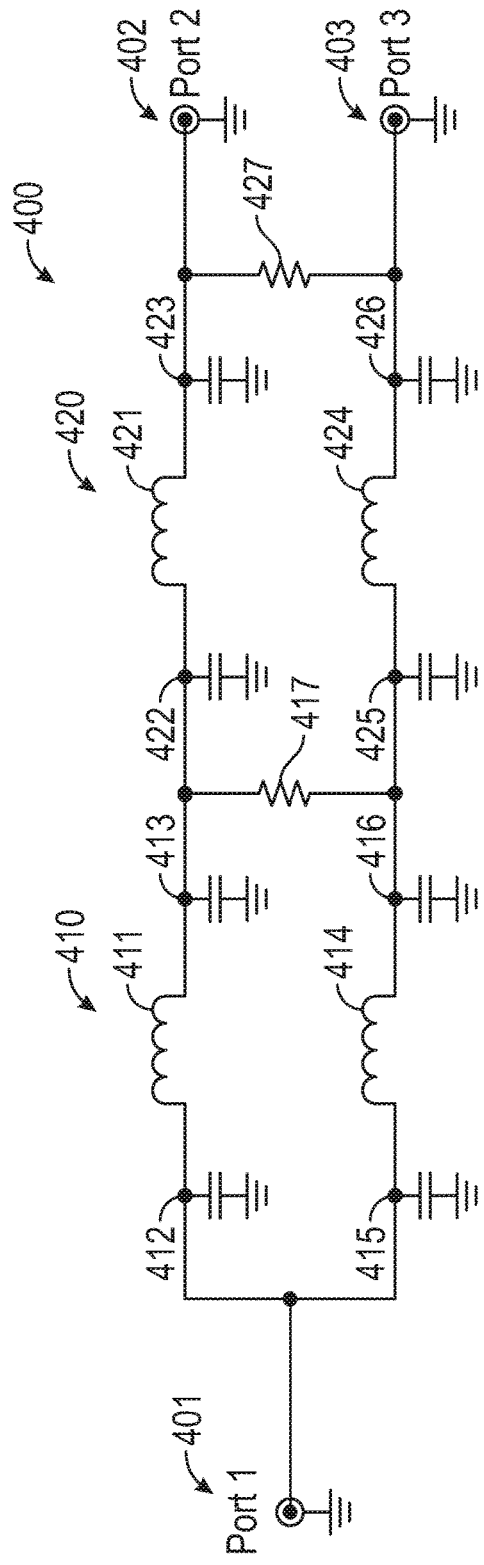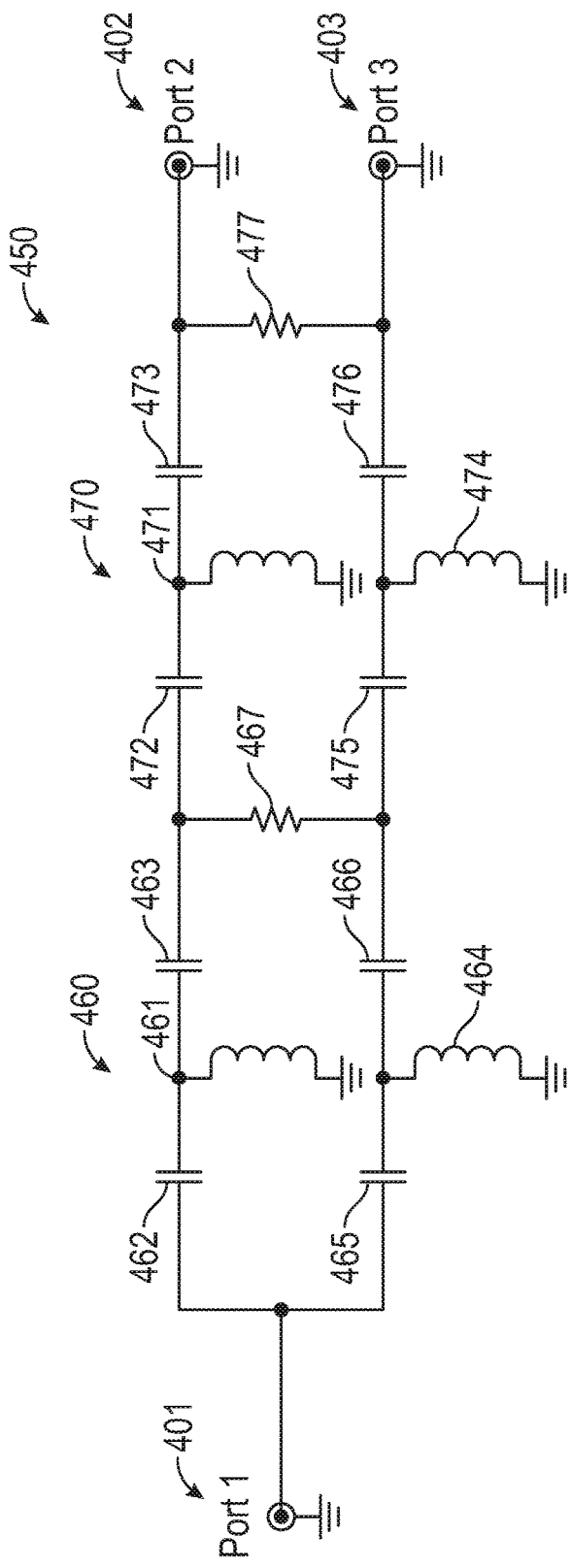
FIG. 4A
FIG. 4B

WILKINSON COMBINER WITH COUPLED INDUCTORS

FIELD OF THE DISCLOSURE

The present description relates generally to electrical circuits, and more particularly, to a Wilkinson combiner with coupled inductors.

BACKGROUND

Signal processing functionality in electronics can be done by splitting and recombining electromagnetic signals using passive electrical components. In radio frequency and microwave applications, a power divider/combiner circuit such as a Wilkinson divider/combiner can be used to facilitate signal splitting and recombination. However, the achievable bandwidth for output isolation, port matching and insertion loss of the Wilkinson divider/combiner becomes increasingly limited with increasing frequency.

SUMMARY OF THE DISCLOSURE

A power divider/combiner circuit with coupled inductors is provided. With coupled inductors, the new circuit topology exhibits broader bandwidth for insertion loss, port matching and isolation compared with traditional power divider/combiner circuit topologies. The coupled inductors can be implemented for single-stage low-pass networks, multi-stage low-pass networks, or multi-stage wide-band networks. For example, the power divider/combiner circuit includes a first coupled inductor circuit coupled to an input terminal that provides a first signal path to a first output terminal, and a second coupled inductor circuit coupled to the input terminal that provides a second signal path to a second output terminal. Each of the coupled inductor circuits include multiple inductors that are tightly and positively magnetically coupled to one another. Each of the coupled inductor circuits provides an output signal that is based on a transfer function that includes a coupling coefficient of the corresponding coupled inductor circuit.

According to an embodiment of the present disclosure, a circuit includes a first coupled inductor circuit coupled to an input terminal and providing a first signal path between the input terminal and a first output terminal, in which the first coupled inductor circuit includes a first plurality of inductors that are positively magnetically coupled to one another. The circuit also includes a second coupled inductor circuit coupled to the input terminal and providing a second signal path between the input terminal and a second output terminal, the second coupled inductor circuit comprising a second plurality of inductors that are positively magnetically coupled to one another. The circuit also includes an isolation circuit coupled to the first output terminal and the second output terminal, the isolation circuit providing isolation between the first output terminal and the second output terminal.

According to an embodiment of the present disclosure, a system includes a first coupled inductor circuit coupled to a first port and a second port on a first signal path. The system includes a second coupled inductor circuit coupled to the first port and a third port on a second signal path. In some aspects, each of the first coupled inductor circuit and the second coupled inductor circuit comprises at least one pair of positively magnetically coupled inductors in series. In some aspects, the second port and the third port are isolated from one another. In some aspects, the first coupled inductor circuit has a coupling coefficient that corresponds to that of the second coupled inductor circuit.

According to an embodiment of the present disclosure, a system includes a plurality of coupled inductor circuits connected to an input terminal and providing a plurality of signal paths between the input terminal and a plurality of output terminals, in which each of the plurality of coupled inductor circuits includes at least two inductors positively magnetically coupled to one another and associated with different signal paths. The system also includes a first isolation resistor interposed between two of the plurality of coupled inductor circuits. The system also includes a second isolation resistor connected to the plurality of output terminals. In some aspects, each of the plurality of coupled inductor circuits is configured to provide an output signal to a respective one of the plurality of output terminals.

BRIEF DESCRIPTION OF THE DRAWINGS

Certain features of the subject technology are set forth in the appended claims. However, for purposes of explanation, several embodiments of the subject technology are set forth in the following figures.

FIGS. 4A and 4B illustrate schematic diagrams of traditional multi-stage Wilkinson divider/combiner circuits.

DETAILED DESCRIPTION

Figure 1:
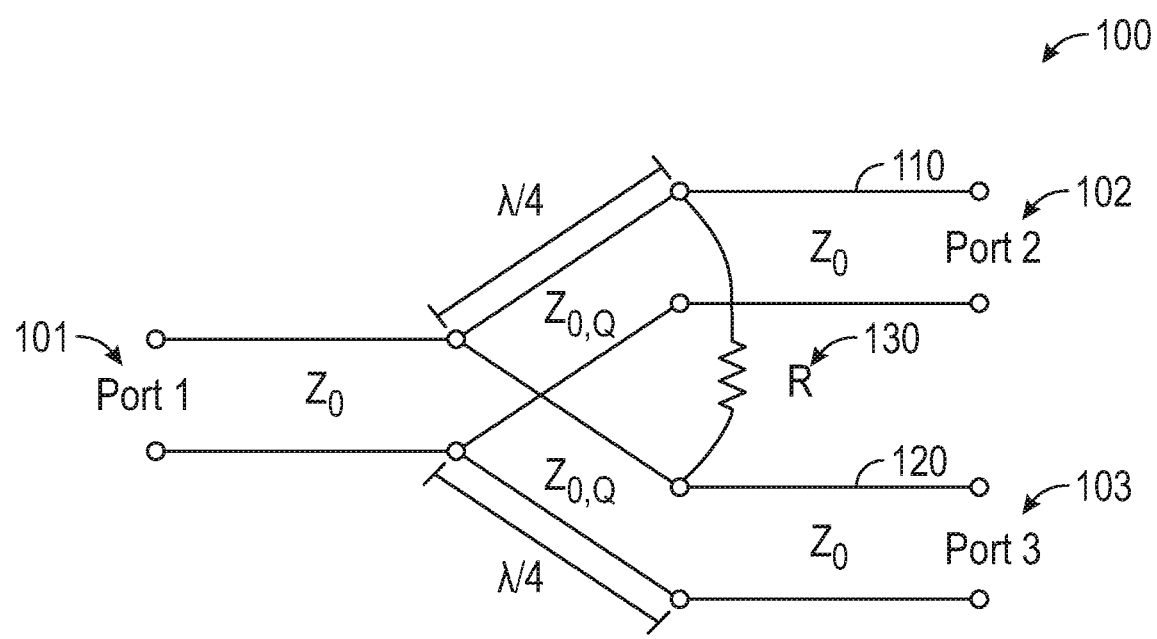
FIG. 1 illustrates a schematic diagram of a traditional Wilkinson divider/combiner circuit.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

A power divider/combiner circuit with coupled inductors is provided. With coupled dividers, the circuit topology of the subject technology exhibits broader bandwidth for insertion loss, port matching and isolation compared with traditional power divider/combiner circuit topologies. The coupled inductors can be implemented for single-stage low-pass networks, multi-stage low-pass networks, or multi-stage wide-band networks.

For each output port path, the power divider/combiner circuit has two tightly and positively magnetically coupled inductors in series between the input port and the output port. For example, in some aspects, the magnetically coupled inductors have coils wrapped around each other to form the tight coupling. In other aspects, the magnetically coupled inductors share a same core to form the tight coupling so that nearly all the magnetic flux from one inductor can flow through the other inductor. In some implementations, the magnetically coupled inductors have a same coupling orientation so that the inductors can be positively coupled to one another. A capacitor connected to ground is coupled between the series-connected coupled inductors. An isolation resistor is coupled between the output ports. The amount of inductive coupling that exists between the coupled inductors can be defined by a coupling coefficient, K.

In a single-stage power divider/combiner circuit with coupled inductors, a first pair of coupled series-connected inductors is coupled between the input port and a first output port, and a second pair of coupled series-connected inductors is coupled between the input port and a second output port. A first capacitor is connected to ground and coupled between the first pair of coupled series-connected inductors, and a second capacitor is connected to ground and coupled between the second pair of coupled series-connected inductors. An isolation resistor is coupled across the first and second output ports. The current may flow in the same direction in both inductors in some aspects, or the current may flow in opposite directions in both inductors in other aspects. The single-stage power divider/combiner circuit with coupled inductors serves as a low-pass network.

A multi-stage power divider/combiner circuit with coupled inductors can have two single-stage circuits connected in series, where a first isolation resistor is coupled across the output ports and in between the two single-stage circuits, and a second isolation resistor is coupled across the output ports after the second single-stage circuit. A multi-stage power divider/combiner circuit with coupled inductors for a wide-band application can include the single-stage coupled-inductor circuit connected in series with a traditional single-stage high-pass network circuit (where the inductors are connected to ground).

In some implementations, a power combiner/divider circuit includes a first coupled inductor circuit coupled to an input terminal and providing a first signal path between the input terminal and a first output terminal, in which the first coupled inductor circuit includes a first plurality of inductors that are tightly and positively magnetically coupled to one another. The circuit also includes a second coupled inductor circuit coupled to the input terminal and providing a second signal path between the input terminal and a second output terminal, the second coupled inductor circuit comprising a second plurality of inductors that are tightly and positively magnetically coupled to one another. The circuit also includes an isolation circuit coupled to the first output terminal and the second output terminal, the isolation circuit providing isolation between the first output terminal and the second output terminal. In some aspects, the first coupled inductor circuit is configured to provide a first output signal to the first output terminal based on a transfer function that includes a first coupling coefficient of the first plurality of inductors, and the second coupled inductor circuit is configured to provide a second output signal to the second output terminal based on a transfer function that includes a second coupling coefficient of the second plurality of inductors.

FIG. 1 illustrates a schematic diagram of a traditional Wilkinson divider/combiner circuit 100. The Wilkinson divider/combiner circuit 100 includes ports 101-103, transmission lines 110 and 120, and an isolation resistor 130. As shown in FIG. 1, the Wilkinson divider/combiner circuit 100 is a differential circuit such that each of the ports 101-103 is applied with two signals of opposite polarities. In this respect, each of the ports 101-103 includes a separate terminal for each of the applied signals. Each of the ports 101-103 is terminated with an impedance, $Z_o$. In some aspects, the impedance at each of the ports 101-103 may be set to 50 ohms. Each of the transmission lines 110 and 120 has a length that is a quarter of a wavelength (e.g., $\lambda/4$), such that each of the transmission lines 110 and 120 represent quarter-wave transformers of impedance that is equivalent to about $\sqrt{2}Z_o$.

The Wilkinson divider/combiner circuit 100 is a passive device that accepts an input signal at the input port and delivers multiple output signals with specific phase and amplitude characteristics at the output ports. The Wilkinson divider/combiner circuit 100 exhibits isolation between the output ports when employed as a power divider. The amount of isolation may depend on the impedance termination between the output ports. The Wilkinson divider/combiner circuit 100 is reciprocal such that it may be used as a power combiner by applying each signal into each of the output ports. The vector sum of the applied signals may appear as a single output at the input port.

In operation, the Wilkinson divider/combiner circuit 100 may be used for signal processing functions such as 1) adding or subtracting signals vectorially, 2) obtaining multiple output signals proportional to the level of a common input signal, 3) dividing an input signal into multiple output signals, and 4) combining signals from different sources to obtain a single output signal. The Wilkinson divider/combiner circuit 100 is a popular power divider/combiner because the circuit is relatively simple to construct and has useful properties: (1) matched at all ports, (2) large isolation between output ports for divider implementations, (3) reciprocal between divider and combiner applications, and (4) lossless when output ports are matched in divider applications.

Figure 2:
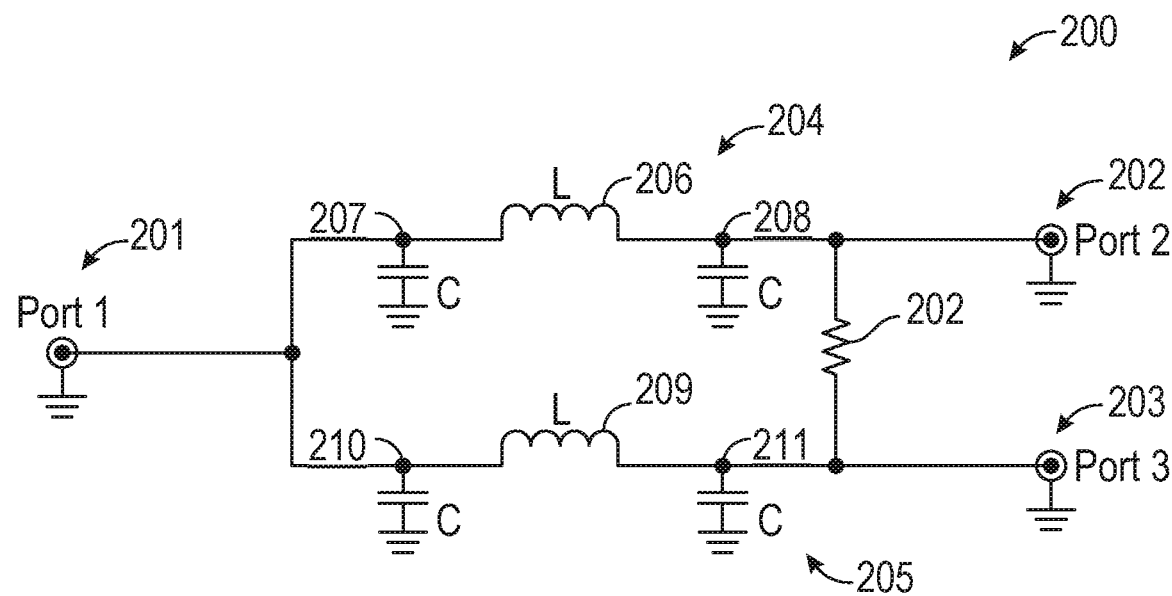
FIGS. 2 and 3 illustrate schematic diagrams of traditional lumped Wilkinson divider/combiner circuits.
Figure 3:
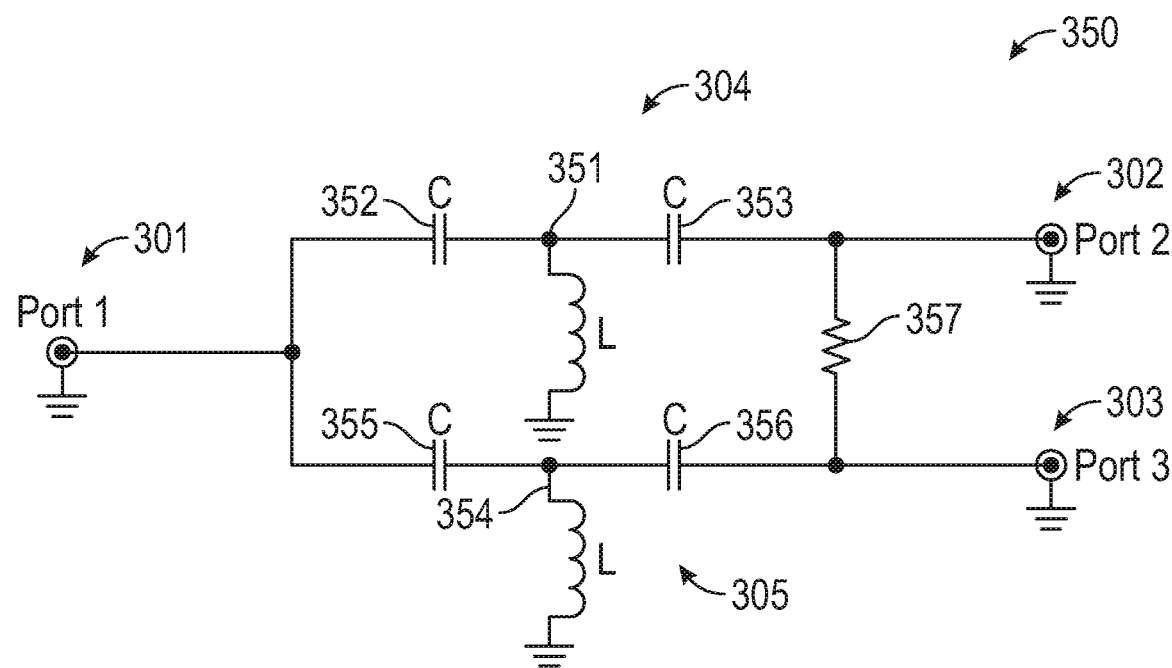

FIGS. 2 and 3 illustrate schematic diagrams of traditional lumped Wilkinson divider/combiner circuits. FIG. 2 illustrates a traditional lumped Wilkinson divider/combiner circuit 200 that may be employed as a low-pass network. The traditional lumped Wilkinson divider/combiner circuit 200 includes ports 201-303, inductors 206 and 209, capacitors 207, 208, 210 and 211, and isolation resistor 212. The lumped elements (e.g., inductors, capacitors) of the traditional lumped Wilkinson divider/combiner circuit 200 replace the transmission lines in the traditional Wilkinson divider/combiner circuit 100 to reduce the size for a more simple integrated implementation.

The Wilkinson divider/combiner circuit 200 includes an inductor (e.g., 206, 209) in series on each output port path (e.g., 204, 205) from the input port 201. For low-pass networks, the inductors 206 and 209 are connected in series with the respective output ports (e.g., 202, 203), and the capacitors 207, 208, 210 and 211 are connected to ground. For each output port path, the inductor is coupled between two capacitors. In particular, the inductor 206 is connected in series with first terminals of the capacitors 207 and 208 along a signal path 204 (where second terminals of the capacitors 207 and 208 are connected to ground). Similarly, the inductor 209 is connected in series with first terminals of the capacitors 210 and 211 along a signal path 205 (where second terminals of the capacitors 210 and 211 are connected to ground). The isolation resistor 212 is coupled across the output ports 202 and 203 to provide isolation between the output ports.

FIG. 3 illustrates a traditional lumped Wilkinson divider/combiner circuit 350 that may be employed as a high-pass network. The traditional lumped Wilkinson divider/combiner circuit 350 of FIG. 3 contains components similar to those shown in the traditional lumped Wilkinson divider/combiner circuit 200 of FIG. 2. The traditional lumped Wilkinson divider/combiner circuit 350 includes ports 301-303, inductors 351 and 354, capacitors 352, 353, 355 and 356, and isolation resistor 357.

The Wilkinson divider/combiner circuit 350 includes an inductor (e.g., 351, 354) coupled to ground on each output port path (e.g., 304, 305). For high-pass networks, the inductors 351 and 354 are connected to ground and the capacitors 352, 353, 355 and 356 are connected in series with the respective output ports (e.g., 302 and 303). For each output port path, the inductor is coupled between two capacitors. In particular, a first terminal of the inductor 351 is connected to ground and a second terminal of the inductor 351 is coupled to a node along a signal path 304 and in between the capacitors 352 and 353 connected in series along the signal path 304. Similarly, a first terminal of the inductor 354 is connected to ground and a second terminal of the inductor 354 is coupled to a node along a signal path 305 and in between the capacitors 355 and 356 connected in series along the signal path 305. The isolation resistor 357 is coupled across the output ports 302 and 303 to provide isolation between the output ports.

FIGS. 4A and 4B illustrate schematic diagrams of traditional multi-stage Wilkinson divider/combiner circuits. Multi-stage Wilkinson divider/combiner circuits are used for wider bandwidth compared to the traditional lumped Wilkinson divider/combiner circuits of FIGS. 2 and 3. For example, each stage may include the circuitry described in FIGS. 2 and 3, where the stages are connected in series to form multiple stages for both low-pass and high-pass networks.

FIG. 4A illustrates a traditional multi-stage Wilkinson divider/combiner circuit 400 that may be employed as a multi-stage low-pass network. The traditional multi-stage Wilkinson divider/combiner circuit 400 includes ports 401-403, inductors 411, 414, 421, and 424, capacitors 412, 413, 415, 416, 422, 423, 425, and 426, and isolation resistors 417 and 427.

The traditional multi-stage Wilkinson divider/combiner circuit 400 includes a first stage 410 in series with a second stage 420 between the input port 401 and the output ports 402 and 403. In the first stage 410, each signal path includes an inductor (e.g., 411, 414) connected in series with a respective output port (e.g., 402, 403). The second stage 420 has a similar circuit topology as the first stage 410, where an inductor (e.g., 421, 424) is connected in series with a respective output port (e.g., 402, 403). For low-pass networks, the inductors 411 and 414 of the first stage 410 are connected in series with the respective output ports (e.g., 402, 403), and the capacitors 412, 413, 415, 416 of the first stage 410 are connected to ground.

For each signal path in the first and second stages, the inductor is coupled between two capacitors. In the first stage 410, the inductor 411 is connected in series with first terminals of the capacitors 412 and 413 along a first signal path to the output port 402 (where second terminals of the capacitors 412 and 413 are connected to ground). Similarly, the inductor 414 of the first stage 410 is connected in series with first terminals of the capacitors 415 and 416 along a second signal path to the output port 403 (where second terminals of the capacitors 415 and 416 are connected to ground). The isolation resistor 417 is coupled to the first terminals of the capacitors 413 and 416 to provide isolation between the output ports 402 and 403 at an intermediate node between the first stage 410 and the second stage 420.

In the second stage 420, the inductor 421 is connected in series with first terminals of the capacitors 422 and 423 along the first signal path to the output port 402 (where second terminals of the capacitors 422 and 423 are connected to ground). Similarly, the inductor 424 of the second stage 420 is connected in series with first terminals of the capacitors 425 and 426 along the second signal path to the output port 403 (where second terminals of the capacitors 425 and 426 are connected to ground). The isolation resistor 427 is coupled to the first terminals of the capacitors 423 and 426 to provide isolation between the output ports 402 and 403 at the output of the second stage 420.

FIG. 4B illustrates a traditional multi-stage Wilkinson divider/combiner circuit 450 that may be employed as a multi-stage high-pass network. The traditional multi-stage Wilkinson divider/combiner circuit 450 includes ports 401-403, inductors 461, 464, 471, and 474, capacitors 462, 463, 465, 466, 472, 473, 475, and 476, and isolation resistors 467 and 477.

The traditional multi-stage Wilkinson divider/combiner circuit 450 includes a first stage 460 in series with a second stage 470 between the input port 401 and the output ports 402 and 403. In the first stage 460, each signal path includes an inductor (e.g., 461, 464) connected to ground and in between a pair of capacitors (e.g., 462, 463, 465, 466) that are series connected to a respective output port (e.g., 402, 403). The second stage 470 has a similar circuit topology as the first stage 460, where an inductor (e.g., 471, 474) is connected to ground and in between a pair of capacitors (e.g., 472, 473, 475, 476) that are series connected to a respective output port (e.g., 402, 403).

For each signal path in the first and second stages, the inductor is coupled between two capacitors. In the first stage 460, the series-connected capacitors 462 and 463 are coupled to a first terminal of the inductor 461 along a first signal path to the output port 402 (where a second terminal of the inductor 461 is connected to ground). Similarly, the series-connected capacitors 465 and 466 are coupled to a first terminal of the inductor 464 along a second signal path to the output port 403 (where a second terminal of the inductor 464 is connected to ground). The isolation resistor 467 is coupled to the first terminals of the capacitors 463 and 466 to provide isolation between the output ports 402 and 403 at an intermediate node between the first stage 460 and the second stage 470.

In the second stage 470, the series-connected capacitors 472 and 473 are coupled to a first terminal of the inductor 471 along the first signal path to the output port 402 (where a second terminal of the inductor 471 is connected to ground). Similarly, the series-connected capacitors 475 and 476 are coupled to a first terminal of the inductor 474 along the second signal path to the output port 403 (where a second terminal of the inductor 474 is connected to ground). The isolation resistor 477 is coupled to the first terminals of the capacitors 473 and 476 to provide isolation between the output ports 402 and 403 at the output of the second stage 470.

Figure 5:
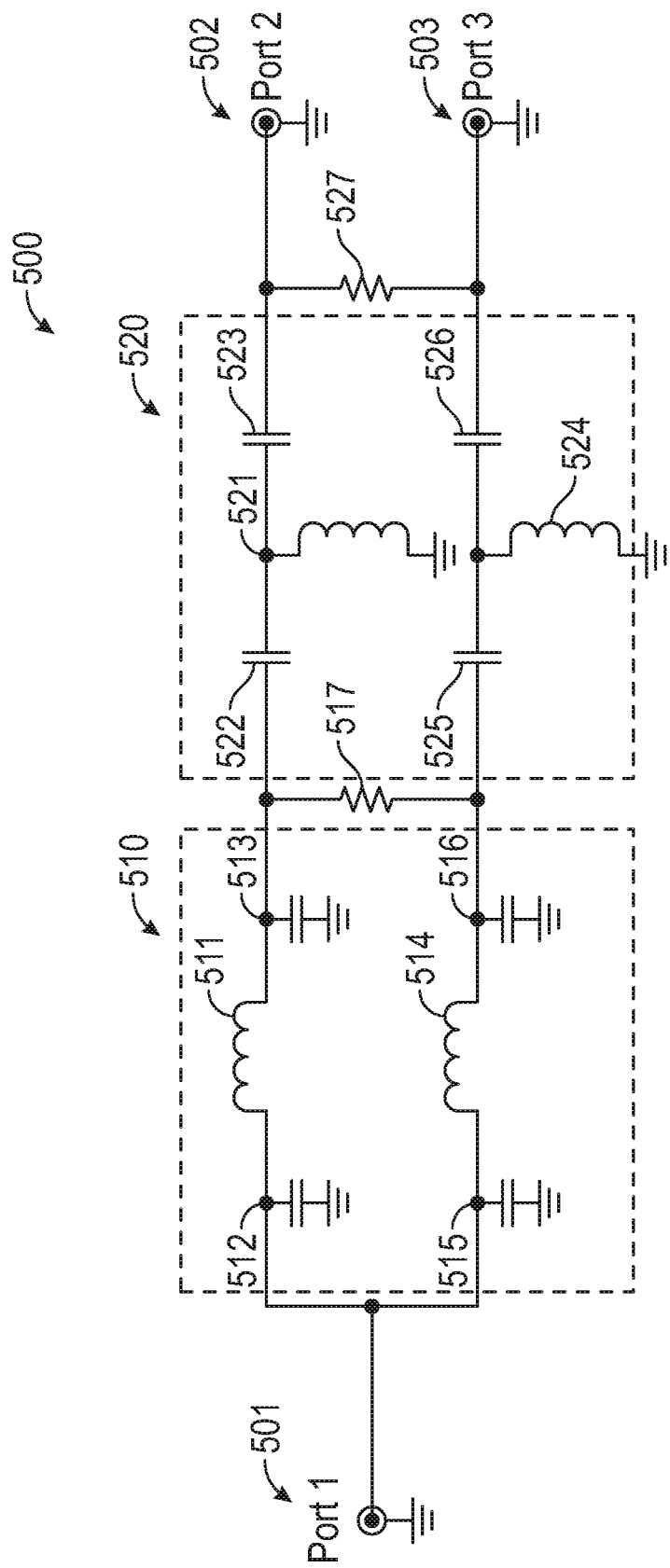
FIG. 5 illustrates a schematic diagram of a traditional multi-stage Wilkinson divider/combiner circuit.

FIG. 5 illustrates a schematic diagram of a traditional multi-stage Wilkinson divider/combiner circuit 500. In FIG. 5, the stages can be mixed such that a first stage (e.g., 510) directed to a low-pass network can be connected in series with a second stage (e.g., 520) directed to a high-pass network to form a wide-band network.

The traditional multi-stage Wilkinson divider/combiner circuit 500 includes ports 501-503 and isolation resistors 517 and 517. In the first stage 510, the traditional multi-stage Wilkinson divider/combiner circuit 500 includes inductors 511 and 514, and capacitors 512, 513, 515, and 516. In the first stage 520, the traditional multi-stage Wilkinson divider/combiner circuit 500 includes inductors 521 and 524, and capacitors 522, 523, 525, and 526.

In the first stage 510, the inductor 511 is connected in series with first terminals of the capacitors 512 and 513 along a first signal path to the output port 502 (where second terminals of the capacitors 512 and 513 are connected to ground). Similarly, the inductor 514 of the first stage 510 is connected in series with first terminals of the capacitors 515 and 516 along a second signal path to the output port 503 (where second terminals of the capacitors 515 and 516 are connected to ground). The isolation resistor 517 is coupled to the first terminals of the capacitors 513 and 516 to provide isolation between the output ports 502 and 503 at an intermediate node between the first stage 510 and the second stage 520.

In the second stage 520, the series-connected capacitors 522 and 523 are coupled to a first terminal of the inductor 521 along the first signal path to the output port 502 (where a second terminal of the inductor 521 is connected to ground). Similarly, the series-connected capacitors 525 and 526 are coupled to a first terminal of the inductor 524 along the second signal path to the output port 503 (where a second terminal of the inductor 524 is connected to ground). The isolation resistor 527 is coupled to the first terminals of the capacitors 523 and 526 to provide isolation between the output ports 502 and 503 at the output of the second stage 520.

Figure 6A:
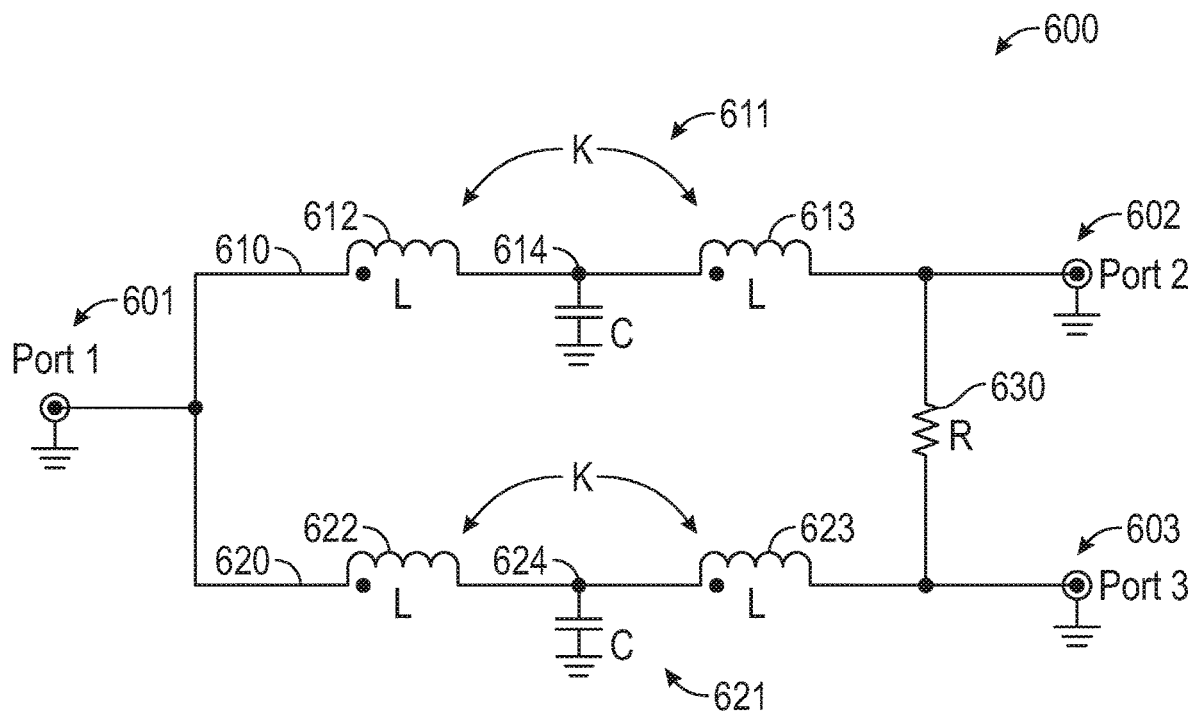
FIG. 6A illustrates a schematic diagram of an example of Wilkinson divider/combiner circuits with magnetically coupled inductors in accordance with one or more implementations.
Figure 6B:
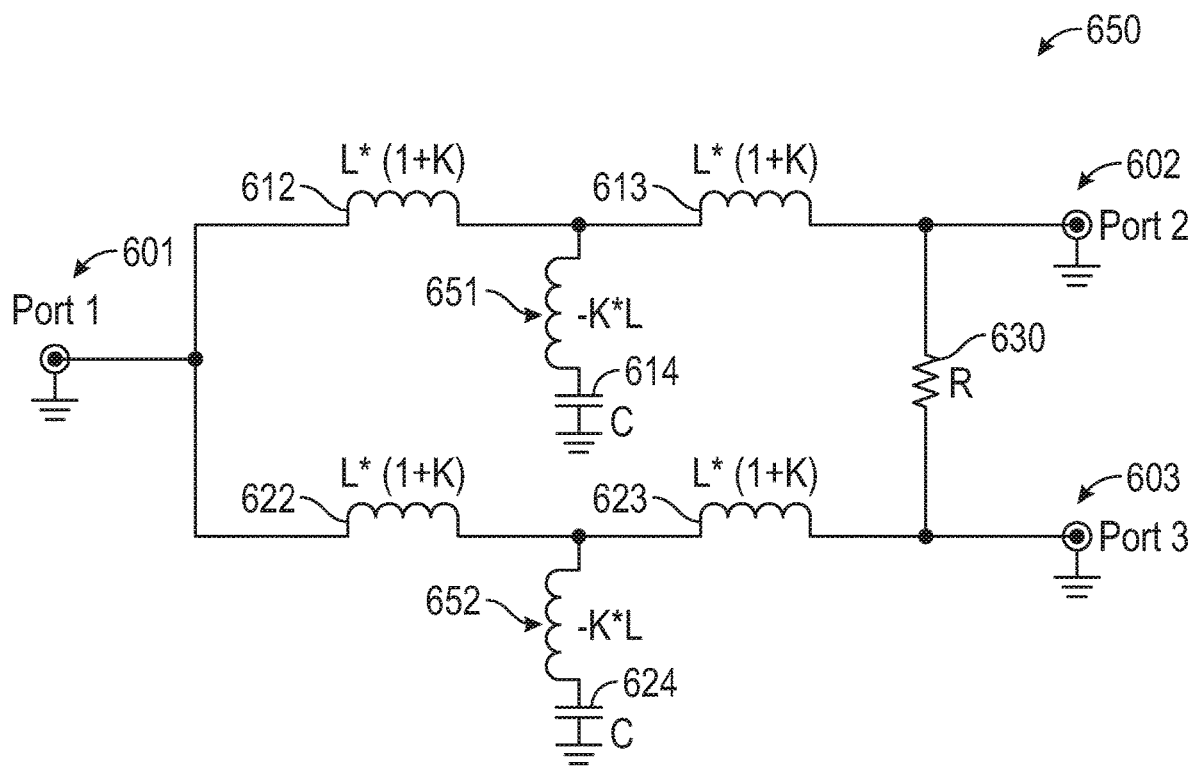
FIG. 6B illustrates a schematic diagram of the equivalent circuit of FIG. 6A.

FIGS. 6A and 6B illustrate schematic diagrams of an example of Wilkinson divider/combiner circuits with magnetically coupled inductors in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

FIG. 6A illustrates an example of a Wilkinson divider/combiner circuit 600 with magnetically coupled inductors. The Wilkinson divider/combiner circuit 600 includes ports 601-603, inductors 612, 613, 622, and 623, capacitors 614 and 624, and an isolation resistor 630. The Wilkinson divider/combiner circuit 600 includes two series-connected inductors (e.g., 612, 613) and the capacitor 603 along a first signal path 610 forming a "T" arrangement between the input port 601 and the output port 602. In particular, the input port 601 is coupled to a first terminal of the inductor 612 and the output port 602 is coupled to a first terminal of the inductor 613 (where second terminals of the inductors 612 and 613 are tightly and positively magnetically coupled to one another). The second terminals of the inductors 612 and 613 also couple to a first terminal of the capacitor 614 (where a second terminal of the capacitor 614 is connected to ground). In some aspects, the inductors 612 and 613 have coils wrapped around each other to form the tight coupling. In other aspects, the inductors 612 and 613 share a same core to form the tight coupling so that nearly all the magnetic flux from the inductor 612 can flow through the inductor 613, for example. In some implementations, the inductors 612 and 613 also have a same coupling orientation so that the inductors can be positively coupled to one another.

The Wilkinson divider/combiner circuit 600 also includes two series-connected inductors (e.g., 622, 623) and the capacitor 624 along a second signal path 620 forming a similar "T" arrangement as that along the first signal path 610 between the input port 601 and the output port 603. The input port 601 is coupled to a first terminal of the inductor 622 and the output port 603 is coupled to a first terminal of the inductor 623 (where second terminals of the inductors 622 and 623 are tightly and positively magnetically coupled to one another). The second terminals of the inductors 622 and 623 also couple to a first terminal of the capacitor 624 (where a second terminal of the capacitor 624 is connected to ground). Similarly to the inductors 612 and 613, the inductors 622 and 623 may have coils wrapped around each other to form the tight coupling. In some aspects, the inductors 622 and 623 share a same core to form the tight coupling so that nearly all the magnetic flux from the inductor 622 can flow through the inductor 623, for example. In some implementations, the inductors 622 and 623 also have a same coupling orientation so that the inductors can be positively coupled to one another.

The isolation resistor 630 is coupled to first terminals of the inductors 613 and 623 and to the output ports 602 and 603 to provide isolation between the output ports 602 and 603. In one or more implementations, the series-connected inductors 612 and 613 may generally refer to a first coupled inductor circuit (e.g., 611), and the series-connected inductors 622 and 623 may generally refer to a second coupled inductor circuit (e.g., 621). The input port 601 may generally refer to a first terminal, the output port 602 may generally refer to a second terminal, and the output port 603 may generally refer to a third terminal.

In one or more implementations, the first coupled inductor circuit (e.g., 611) is configured to provide a first output signal to the output port 602 (or first output terminal) based on a transfer function that includes a first coupling coefficient (e.g., K1) of the series-connected inductors 612 and 613. In some implementations, the second coupled inductor circuit (e.g., 621) is configured to provide a second output signal to the output port 603 (or second output terminal) based on a transfer function that includes a second coupling coefficient (e.g., K2) of the series-connected inductors 622 and 623.

The first and second coupled inductor circuits (e.g., 611, 621) have series-connected inductors with a same inductance, L. The capacitors 614 and 624 have a same capacitance, C. The first and second coupled inductor circuits (e.g., 611, 621) have a same coupling coefficient, K, where the amount of inductive coupling between the inductors 612 and 613 corresponds to that of the inductors 622 and 623. In some aspects, the coupling coefficient is greater than zero and smaller than 1 (e.g., K<1). In some implementations, the coupling coefficient is in a range of 0.7 and 0.9.

In some aspects, the current flows through each of the series-connected inductors (e.g., 612, 613, 622, 623) in the same direction, which may be denoted by a dot convention. In FIG. 6A, the current flows from the input port 601 and enters the first terminal of the inductor 612 (noted by a dot location at the first terminal) and exits though the second terminal of the inductor 612 and enters the first terminal of the inductor 613 (noted by the dot location at the first terminal) and exits through the second terminal of the inductor 613 to the output port 602. Similarly, the current flows from the input port 601 and enters the first terminal of the inductor 622 (noted by the dot location at the first terminal) and exits though the second terminal of the inductor 622 and enters the first terminal of the inductor 623 (noted by the dot location at the first terminal) and exits through the second terminal of the inductor 623 to the output port 603. The same dot convention employed by the inductors 612, 613, 622, 623 represents that the inductors are tightly and positively magnetically coupled to another.

The Wilkinson divider/combiner circuit 650 of FIG. 6B contains components similar to those shown in the Wilkinson divider/combiner circuit 600 of FIG. 6A. The Wilkinson divider/combiner circuit 650 represents an equivalent model for the Wilkinson divider/combiner circuit 600. When the inductors are tightly and magnetically coupled to one another as a "T" arrangement, a negative coupling is observed. For example, the inductors 612, 613, for example, effectively add a negative shunt inductance (e.g., 651) in the first signal path 610, which is in series with the capacitor 614, and the negative shunt inductance 651 can cancel out the pole and extend the bandwidth of the Wilkinson divider/combiner circuit 650. Similarly, in the second signal path 620, the inductors 622, 623, effectively add a negative shunt inductance (e.g., 652). In FIG. 6B, each of the inductors 612, 613, 622, 623 is defined by an inductance expressed as L*(1+K), where K is the coupling coefficient. The shunt inductances 651 and 652 are expressed as -K*L.

Figure 7A:
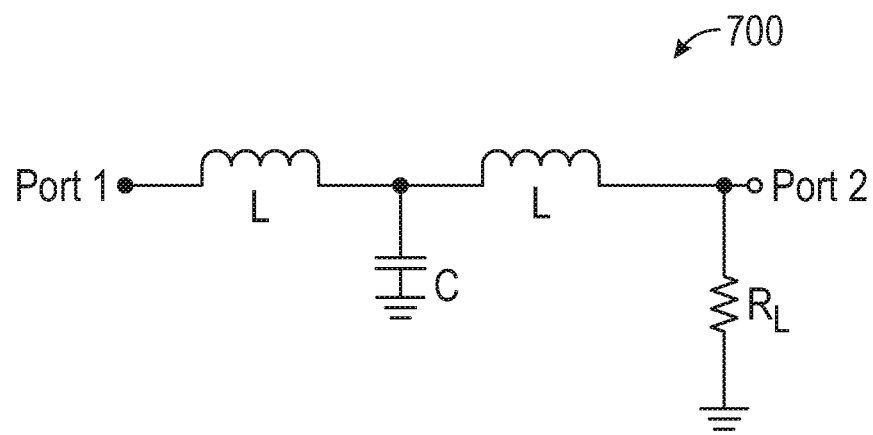
FIG. 7A illustrates a schematic diagram of a combiner model in accordance with one or more implementations.

FIG. 7A illustrates a schematic diagram a combiner model 700 in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The transfer function for the combiner model 700 may be defined as $$S = \frac{j \cdot R_L}{\omega^3 \cdot L^2 \cdot C - 2 \cdot \omega \cdot L + j \cdot R_L \cdot (1 - \omega^2 \cdot L \cdot C)},$$

where $\omega$ is a radial frequency, $R_L$ is an impedance of the isolation circuit, L is an inductance of each inductor, C is the capacitance, and j is an imaginary value.

Figure 7B:
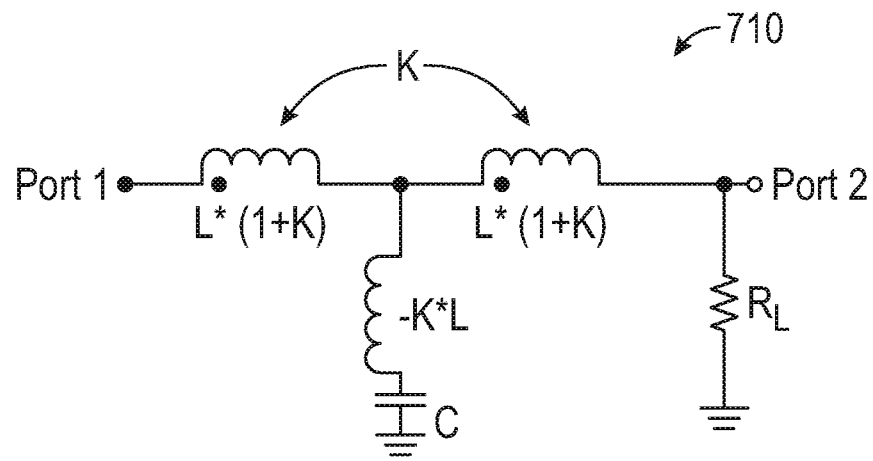
FIG. 7B illustrates a schematic diagram of the equivalent circuit of FIG. 7A.

FIG. 7B illustrates a schematic diagram of an equivalent circuit of a combiner model 710 with magnetically coupled inductors in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The combiner model 710 of FIG. 7B contains components similar to those shown in the Wilkinson divider/combiner circuit 650 of FIG. 6B with the inclusion of a load resistor ($R_L$). In some implementations, the transfer function is a function of the first and second coupling coefficients, an impedance of the isolation circuit, inductances of the first and second plurality of inductors, capacitances associated with the first and second coupled inductor circuits, and a radial frequency associated with the first and second coupled inductor circuits. In one or more implementations, the transfer function for the combiner model 710 may be defined, for example, as $$S = \frac{j \cdot R_L \cdot (1 + \omega^2 \cdot K \cdot L \cdot C)}{\omega^3 \cdot L^2 \cdot C \cdot (K^2 - 1) + 2 \cdot \omega \cdot L \cdot (K + 1) + j \cdot R_L \cdot (\omega^2 \cdot L \cdot C - 1)},$$

where $\omega$ is a radial frequency (e.g., $2\pi$*frequency), $R_L$ is an impedance of the isolation circuit, K is the coupling coefficient, L is an inductance of each of the first coupled inductor circuit and the second coupled inductor circuit, C is a capacitance associated with the first coupled inductor circuit and the second coupled inductor circuit, and j is an imaginary value. In this respect, the transfer function of a signal path between the input and output ports is based on the coupling coefficient of the coupled inductors arranged in the signal path. In some aspects, the transfer function may vary depending on the arrangement of the coupled inductors without departing from the scope of the disclosure.

Figure 7C:
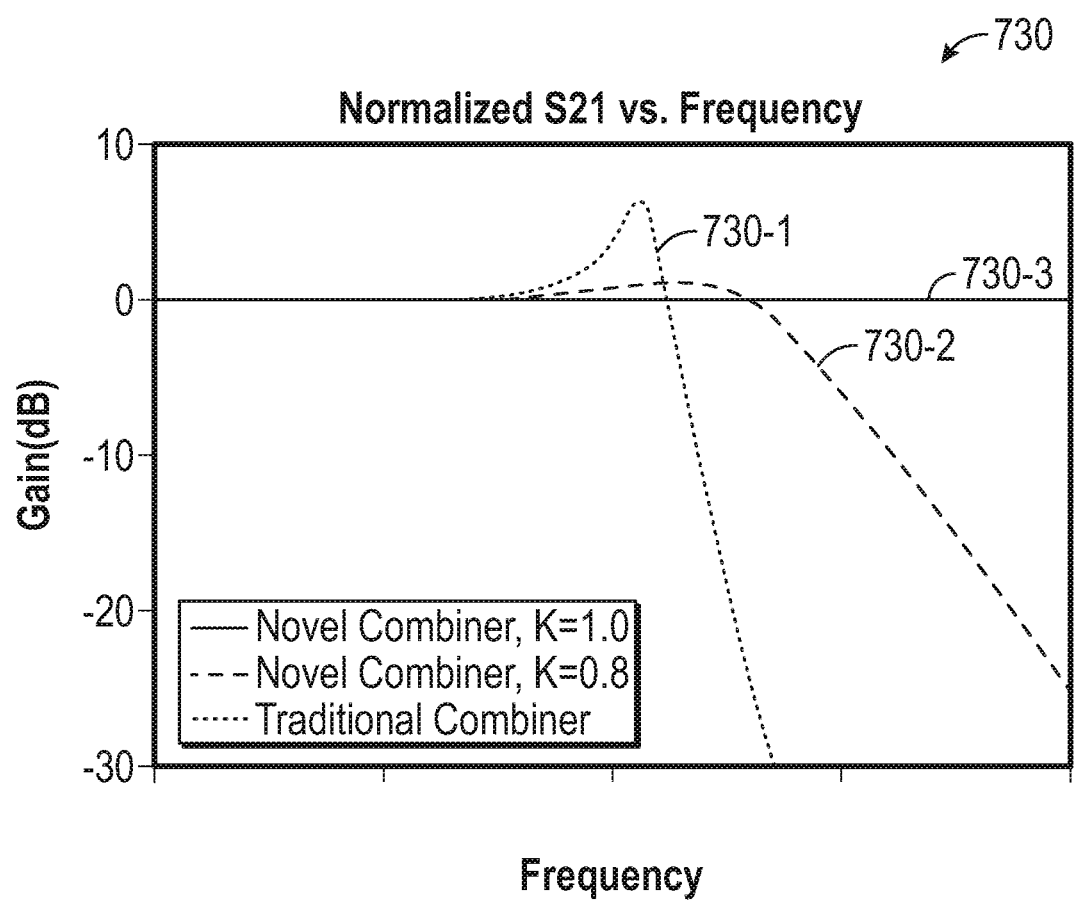
FIG. 7C illustrates a plot of a transfer function of a traditional combiner model compared to transfer functions of a combiner model with the coupled inductors.
Figure 7D:
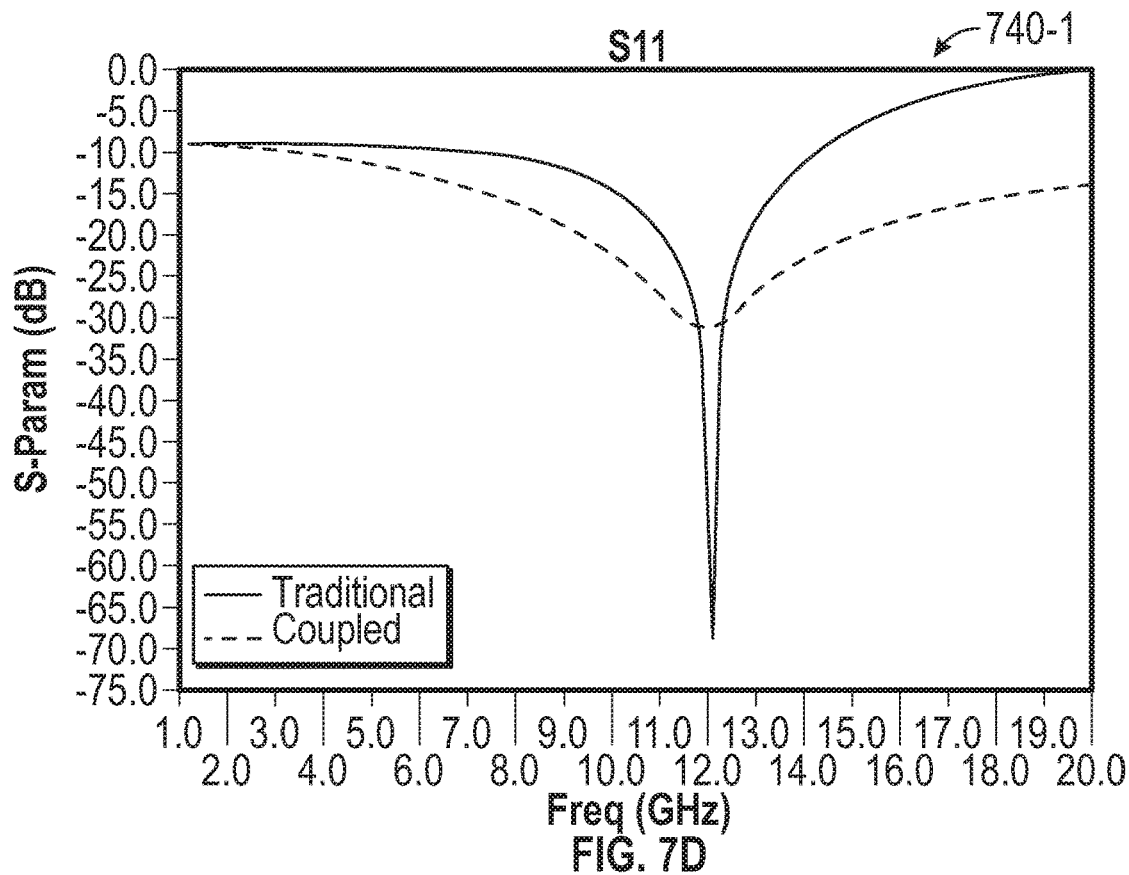
FIGS. 7D to 7G illustrate plots depicting different scattering parameter responses of the traditional combiner model compared to the combiner model with coupled inductors.
Figure 7E:
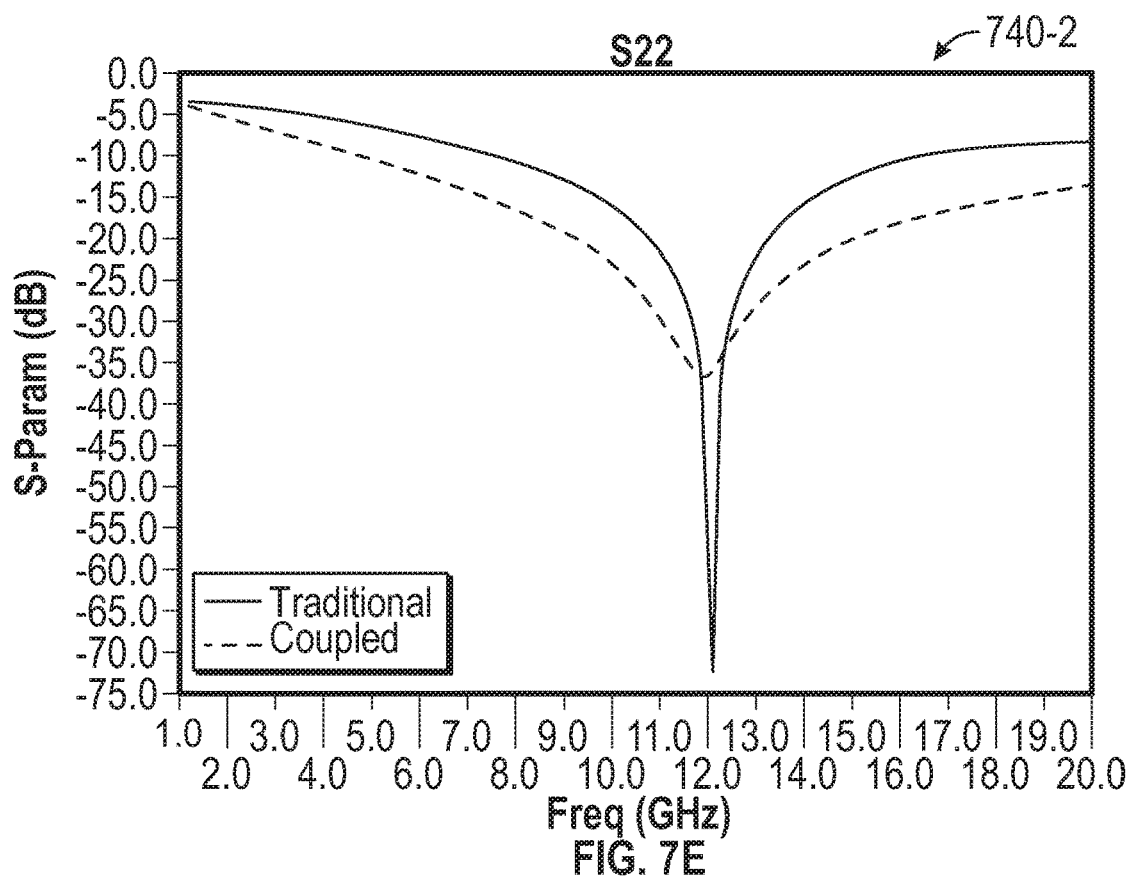
Figure 7F:
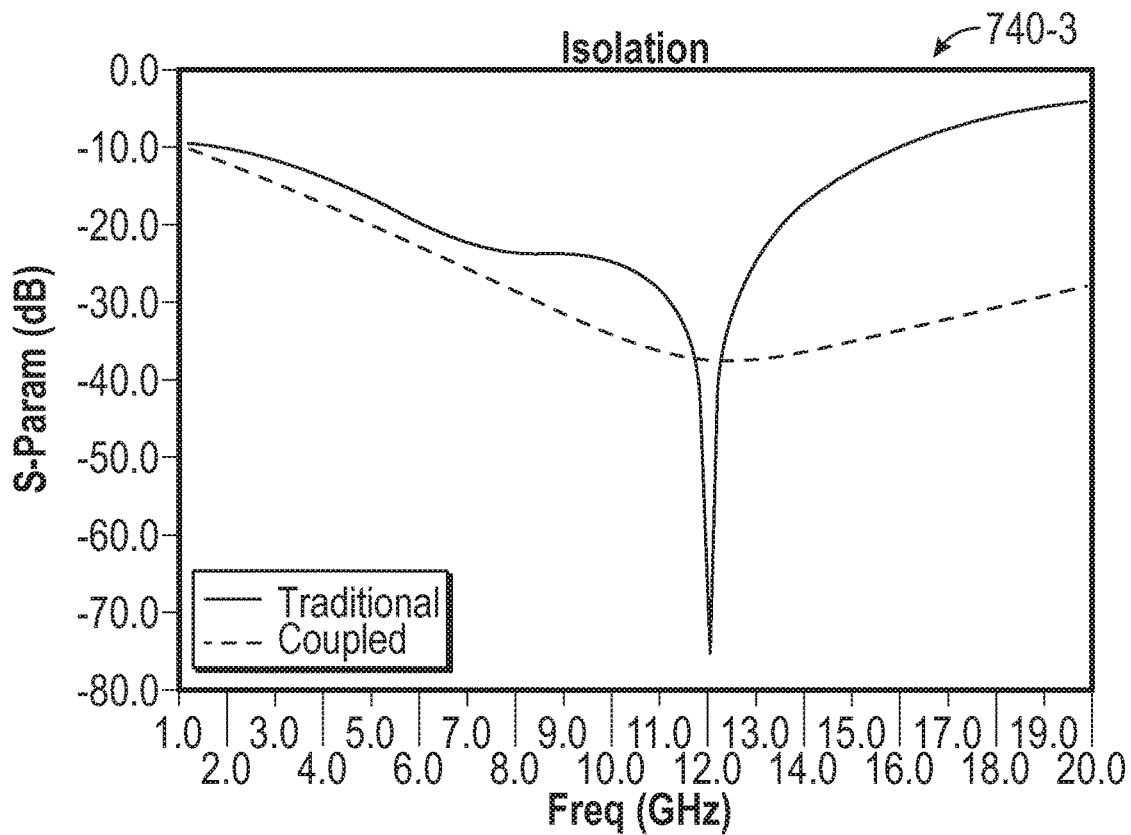
Figure 7G:
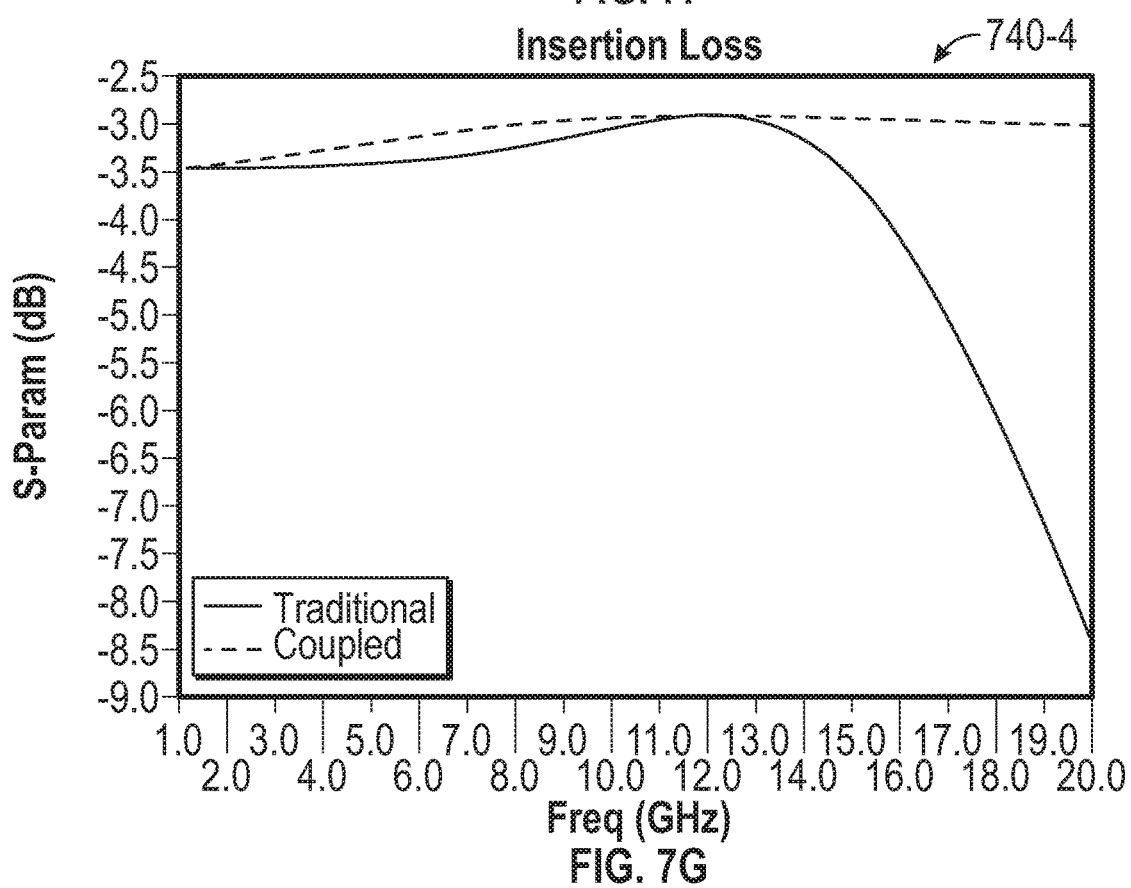

FIG. 7C illustrates a plot 730 of a transfer function of the traditional combiner model compared to transfer functions of the combiner model with the magnetically coupled inductors. The plot 730 depicts a two-dimensional representation of Gain (dB) as a function of frequency. The frequency may be in a range of about $1\times10^9$ Hertz to about $1\times10^{13}$ Hertz but may be designed for a specified bandwidth. The plot 730 includes a first waveform (e.g., 730-1) that corresponds to the traditional combiner model 700, a second waveform (e.g., 730-2) that corresponds to the combiner model 710 with a coupling coefficient set to 0.8, and a third waveform (e.g., 730-3) that corresponds to the combiner model 710 with a coupling coefficient set to 1.0.

In the plot 730, the first waveform 730-1, representing the frequency response of a traditional Wilkinson Combiner, provides a steady-state amplitude signal at lower frequencies before rolling off in a typical $3^{rd}$ order low pass response. The second waveform, representing the Wilkinson Combiner with coupled inductors with a K=0.8, 730-2 provides a more steady-state gain to higher frequencies before rolling, extending the bandwidth, relative to the traditional combiner by a factor of approximately 10×. In this respect, the bandwidth at a desired amplitude is broader compared to the traditional combiner model 700. The third waveform 730-3 provides a steady-state gain amplitude for all observed frequencies, all pass bandwidth, based on the ideal coupling inductance between coupled inductors.

FIGS. 7D to 7G illustrate plots depicting different scattering parameter responses of the traditional combiner model compared to the combiner model with magnetically coupled inductors. Each of the plots (e.g., 740-1, 740-2, 740-3, 740-4) illustrates a first waveform that corresponds to a scattering parameter response of the traditional combiner 700 and a second waveform that corresponds to a scattering parameter response of the combiner model 710. The plot 740-1 depicts the input complex reflection coefficient when a source is placed at the input port (e.g., 601) and terminating the output port (e.g., 602). In the plot 740-1, the second waveform shows a wider bandwidth than the first waveform for a gain amplitude at about −30 dB. The plot 740-2 depicts the input complex reflection coefficient when a source is placed at the output port (e.g., 602) and terminating the input port (e.g., 601). In the plot 740-2, the second waveform also shows a wider bandwidth than the first waveform for a gain amplitude at about −35 dB. The plot 740-3 depicts the isolation between the output ports (e.g., 602, 603). In the plot 740-3, the second waveform shows a much wider bandwidth than the first waveform for a gain amplitude at about −35 dB. The plot 740-4 depicts the insertion loss between the input port (e.g., 601) and the output port (e.g., 602). In the plot 740-4, the second waveform shows a steadier response signal than the first waveform at about −3 dB for all observed frequencies, whereas the first waveform drops sharply at about 13 GHz.

Figure 8A:
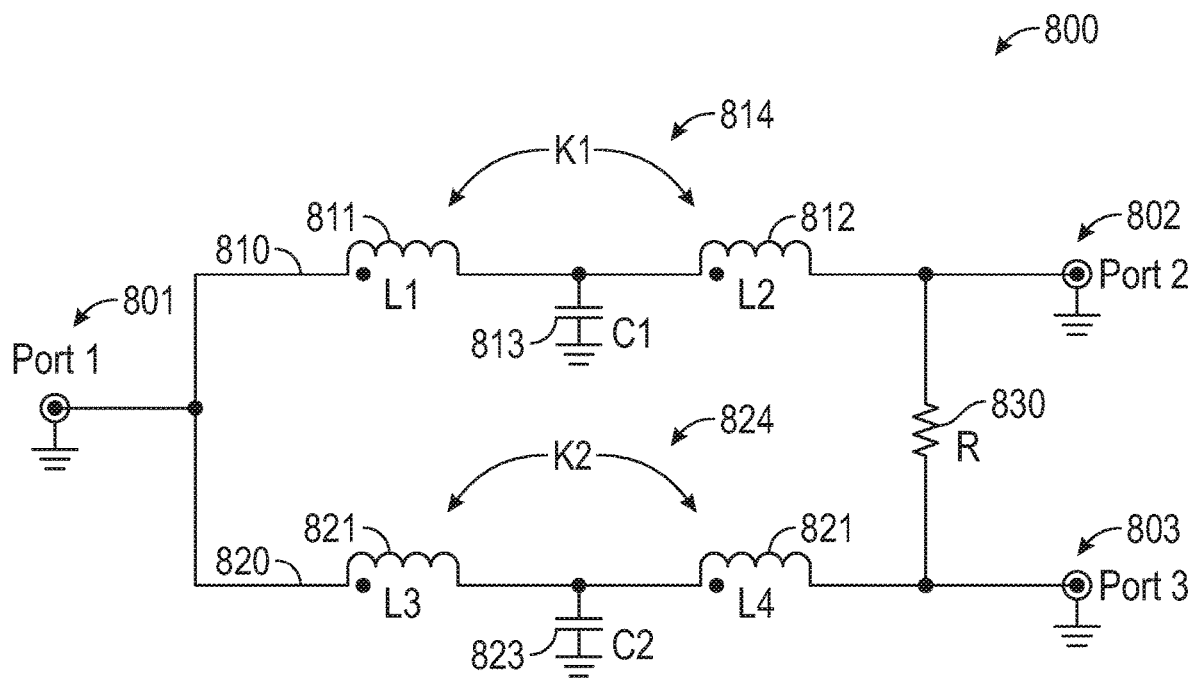
FIGS. 8A and 8B illustrates schematic diagrams of Wilkinson divider/combiner circuits with magnetically coupled inductors having a different coupling orientation in accordance with one or more implementations.
Figure 8B:
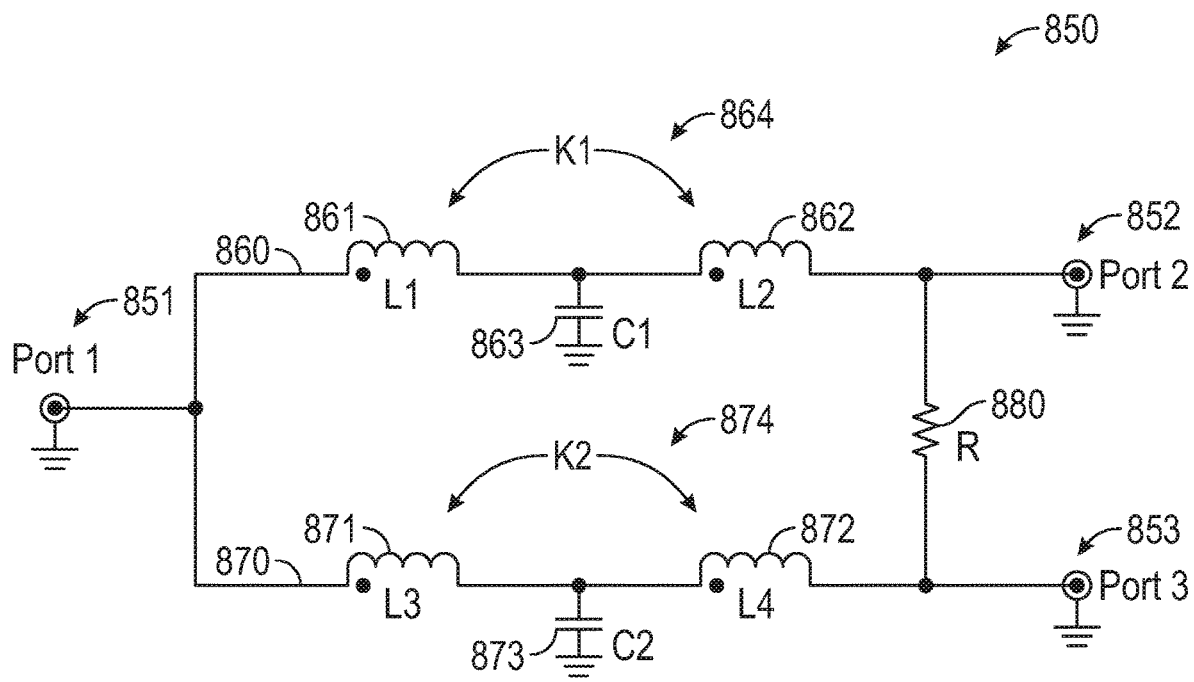

FIGS. 8A and 8B illustrates schematic diagrams of Wilkinson divider/combiner circuits with magnetically coupled inductors having different coupling orientations in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The Wilkinson divider/combiner circuit 800 of FIG. 8A contains components similar to those shown in the Wilkinson divider/combiner circuit 600 of FIG. 6A. The Wilkinson divider/combiner circuit 800 includes ports 801-803, inductors 811, 812, 821, and 822, capacitors 813 and 823, and an isolation resistor 830.

The coupled inductors 811 and 812 have inductances L1 and L2, respectively, and the coupled inductors 821 and 822 have inductances L3 and L4, respectively. The capacitors 813 and 823 have capacitances C1 and C2, respectively. The first and second coupled inductor circuits (e.g., 811/812, 821/822) have coupling coefficients K1 (e.g., 814) and K2 (e.g., 824), respectively. In some aspects, the inductances L1 and L2 are equivalent and correspond to the inductances L3 and L4. In other aspects, the capacitances C1 and C2 correspond to one another, and the coupling coefficients K1 and K2 correspond to one another.

In FIG. 8A, the current flows from the input port 801 and enters the first terminal of the inductor 811 (noted by a dot location at the first terminal) and exits though the second terminal of the inductor 811 and enters the first terminal of the inductor 812 (noted by the dot location at the first terminal) and exits through the second terminal of the inductor 812 to the output port 802. Similarly, the current flows from the input port 801 and enters the first terminal of the inductor 821 (noted by the dot location at the first terminal) and exits though the second terminal of the inductor 821 and enters the first terminal of the inductor 822 (noted by the dot location at the first terminal) and exits through the second terminal of the inductor 822 to the output port 803. The same dot convention employed by the inductors 811, 812, 821, 822 represents that the inductors are tightly and positively magnetically coupled to another.

The Wilkinson divider/combiner circuit 850 of FIG. 8B contains components similar to those shown in the Wilkinson divider/combiner circuit 800 of FIG. 8A. The Wilkinson divider/combiner circuit 850 includes ports 851-853, inductors 861, 862, 871, and 872, capacitors 863 and 873, and an isolation resistor 880. The inductors 861 and 862 have a coupling coefficient K1 (e.g., 864) and the inductors 871 and 872 have a coupling coefficient K2 (e.g., 874).

In FIG. 8B, the dot convention employed by the inductors 861, 862, 871, 872 is different from the dot convention depicted in FIG. 8A. For example, the current flows from the output port 802 and enters the second terminal of the inductor 862 (noted by a dot location at the second terminal) and exits though the first terminal of the inductor 862 and enters the second terminal of the inductor 861 (noted by the dot location at the second terminal) and exits through the first terminal of the inductor 861 to the input port 801. Similarly, the current flows from the output port 803 and enters the second terminal of the inductor 872 (noted by a dot location at the second terminal) and exits though the first terminal of the inductor 872 and enters the second terminal of the inductor 871 (noted by the dot location at the second terminal) and exits through the first terminal of the inductor 871 to the input port 801.

Figure 9:
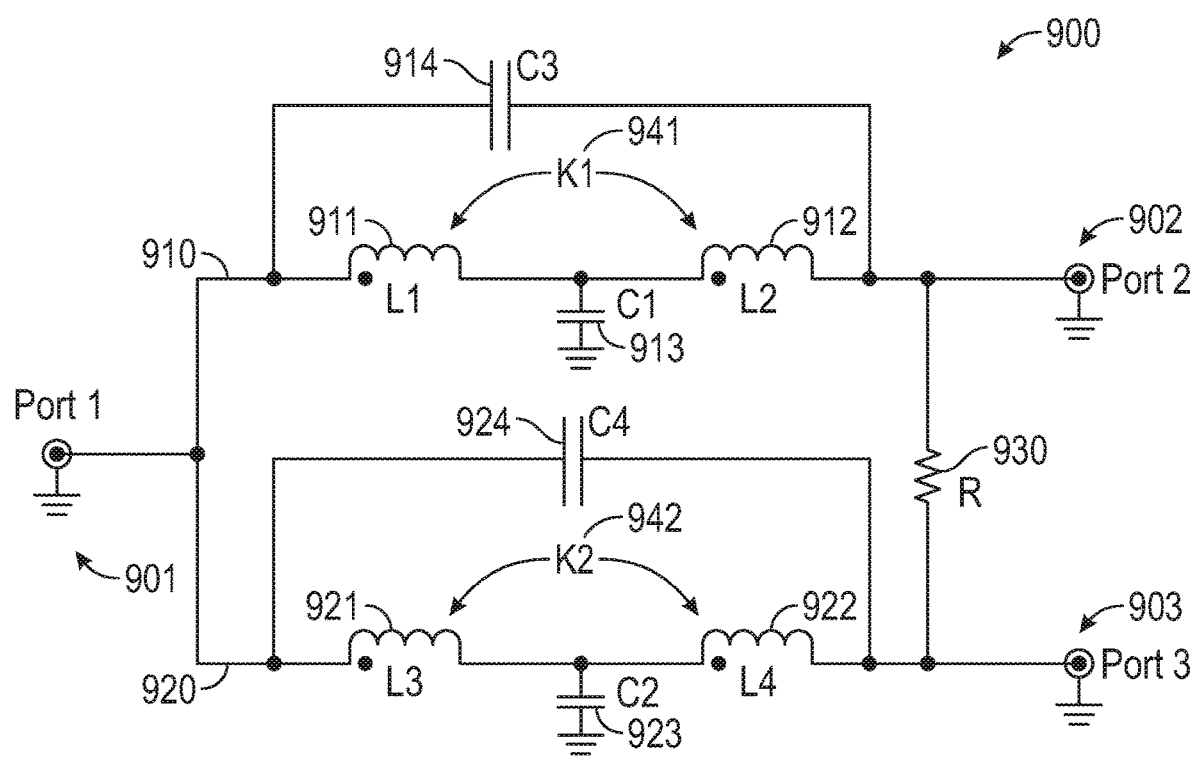
FIG. 9 illustrates a schematic diagram of another example of a Wilkinson divider/combiner circuit with magnetically coupled inductors in accordance with one or more implementations.

FIG. 9 illustrates a schematic diagram of another example of a Wilkinson divider/combiner circuit 900 with magnetically coupled inductors in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The Wilkinson divider/combiner circuit 900 of FIG. 9 contains components similar to those shown in the Wilkinson divider/combiner circuit 800 of FIG. 8A. The Wilkinson divider/combiner circuit 900 includes ports 901-803, inductors 911, 912, 921, and 922, capacitors 913, 914, 923 and 924, and an isolation resistor 930. The inductors 911 and 912 have a coupling coefficient K1 (e.g., 941) and the inductors 921 and 922 have a coupling coefficient K2 (e.g., 942). The capacitor 914 is coupled in parallel to the series-connected inductors 911 and 912 along a first signal path 910 between the input port 901 and the output port 902. The capacitor 924 is coupled in parallel to the series-connected inductors 921 and 922 along a second signal path 920 between the input port 901 and the output port 903. The addition of the capacitors 914 and 924 help to tune the circuit performance. When the coupling coefficients K1 and K2 are not close to 1.0, which is common in real circuit implementation, the capacitors 914 and 924 can be employed to improve the circuit frequency response.

Figure 10:
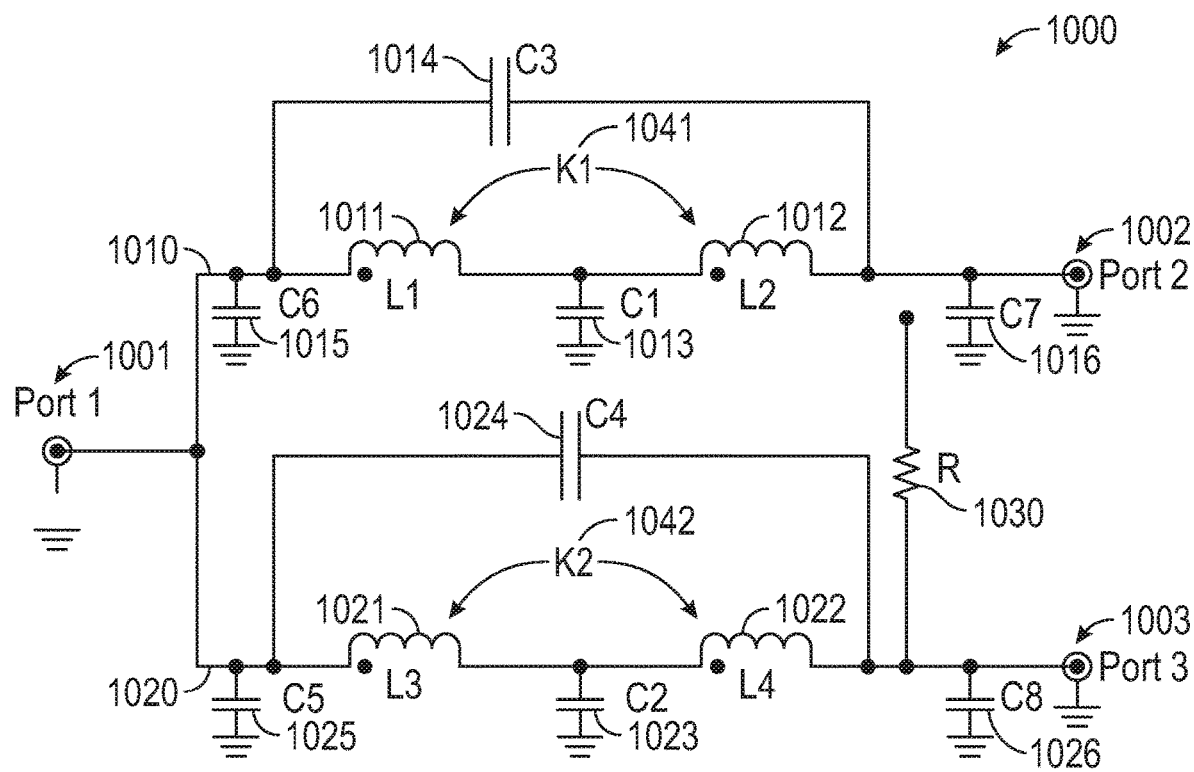
FIG. 10 illustrates a schematic diagram of yet another example of a Wilkinson divider/combiner circuit with magnetically coupled inductors in accordance with one or more implementations.

FIG. 10 illustrates a schematic diagram of yet another example of a Wilkinson divider/combiner circuit 1000 with magnetically coupled inductors in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The Wilkinson divider/combiner circuit 1000 of FIG. 10 contains components similar to those shown in the Wilkinson divider/combiner circuit 900 of FIG. 9. The Wilkinson divider/combiner circuit 1000 includes ports 1001-1003, inductors 1011, 1012, 1021, and 1022, capacitors 1013-1016 and 1023-1026, and an isolation resistor 1030. The inductors 1011 and 1012 have a coupling coefficient K1 (e.g., 1041) and the inductors 1021 and 1022 have a coupling coefficient K2 (e.g., 1024).

The capacitor 1014 is coupled in parallel to the series-connected inductors 1011 and 1012 along a first signal path 1010 between the input port 1001 and the output port 1002. The capacitor 1024 is coupled in parallel to the series-connected inductors 1021 and 1022 along a second signal path 1020 between the input port 1001 and the output port 1003. The first terminals of the capacitors 1015 and 1025 are coupled to the inductors 1011 and 1021, respectively (where the second terminals of the capacitors 1015 and 1025 are connected to ground). Similarly, the first terminals of the capacitors 1016 and 1026 are coupled to the inductors 1012 and 1022, respectively (where the second terminals of the capacitors 1016 and 1026 are connected to ground). The addition of the capacitors 1015, 1016, 1025 and 1026 help to further tune the circuit performance. In this respect, the C6/L1/C1 can function as one section of the transmission line and C1/L2/C7 can function as a second section of the transmission line (or signal path).

Figure 11:
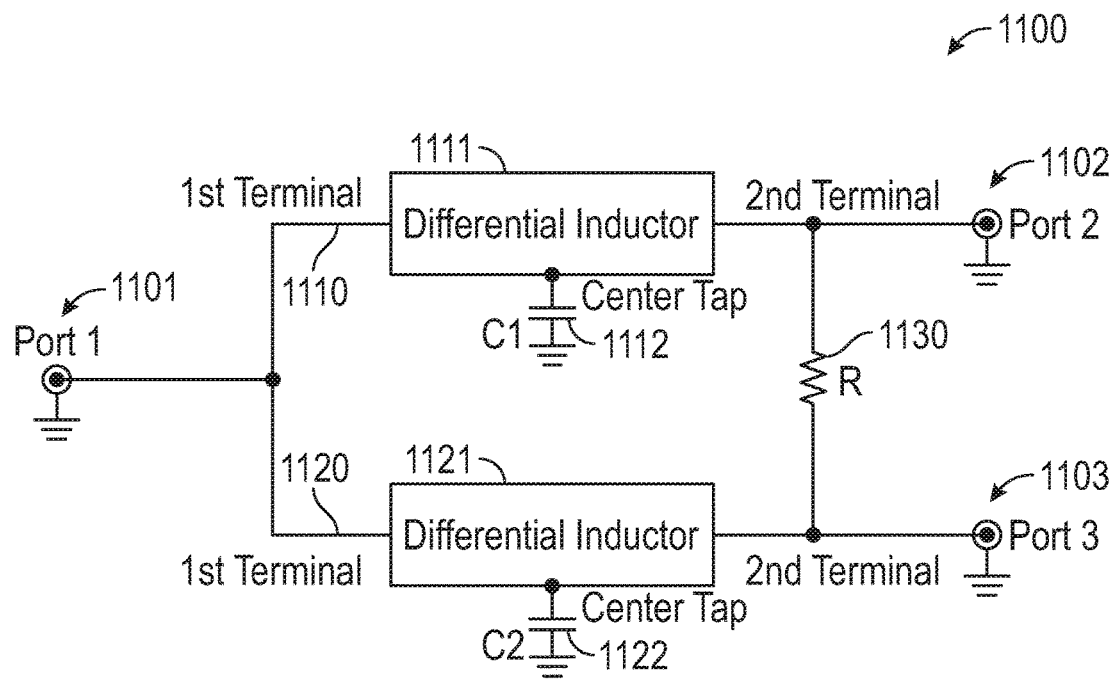
FIG. 11 illustrates a schematic diagram of an example of a Wilkinson divider/combiner circuit with differential inductors in accordance with one or more implementations.

FIG. 11 illustrates a schematic diagram of an example of a Wilkinson divider/combiner circuit 1100 with differential inductors in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The Wilkinson divider/combiner circuit 1100 includes ports 1101-1103, differential inductors 1111 and 1121, capacitors 1112-1122, and an isolation resistor 1130. In some implementations, the first coupled inductor circuit 611 (FIG. 6A) can be replaced (or implemented) by a first differential inductor 1111 and the second coupled inductor circuit 621 (FIG. 6A) can be replaced (or implemented) by a second differential inductor 1121. The Wilkinson divider/combiner circuit 1100 with differential inductors provides the advantage of a smaller circuit size and tight coupling that facilitates the circuit topology for the subject technology.

The first port 1101 is coupled to a first terminal of the first differential inductor 1111 and a first terminal of the second differential inductor 1122. The second port 1102 is coupled to a second terminal of the first differential inductor 1111 on a first signal path 1110 and the third port 1103 is coupled to a second terminal of the second differential inductor 1122 on a second signal path 1120. The first capacitor 1112 is coupled to a first center tap node of the first differential inductor 1111 and the second capacitor 1122 is coupled to a second center tap node of the second differential inductor 1121. The isolation resistor 130 is coupled to the first signal path 1110 and the second signal path 1120 to provide isolation between the output ports 1102 and 1103.

Figure 12:
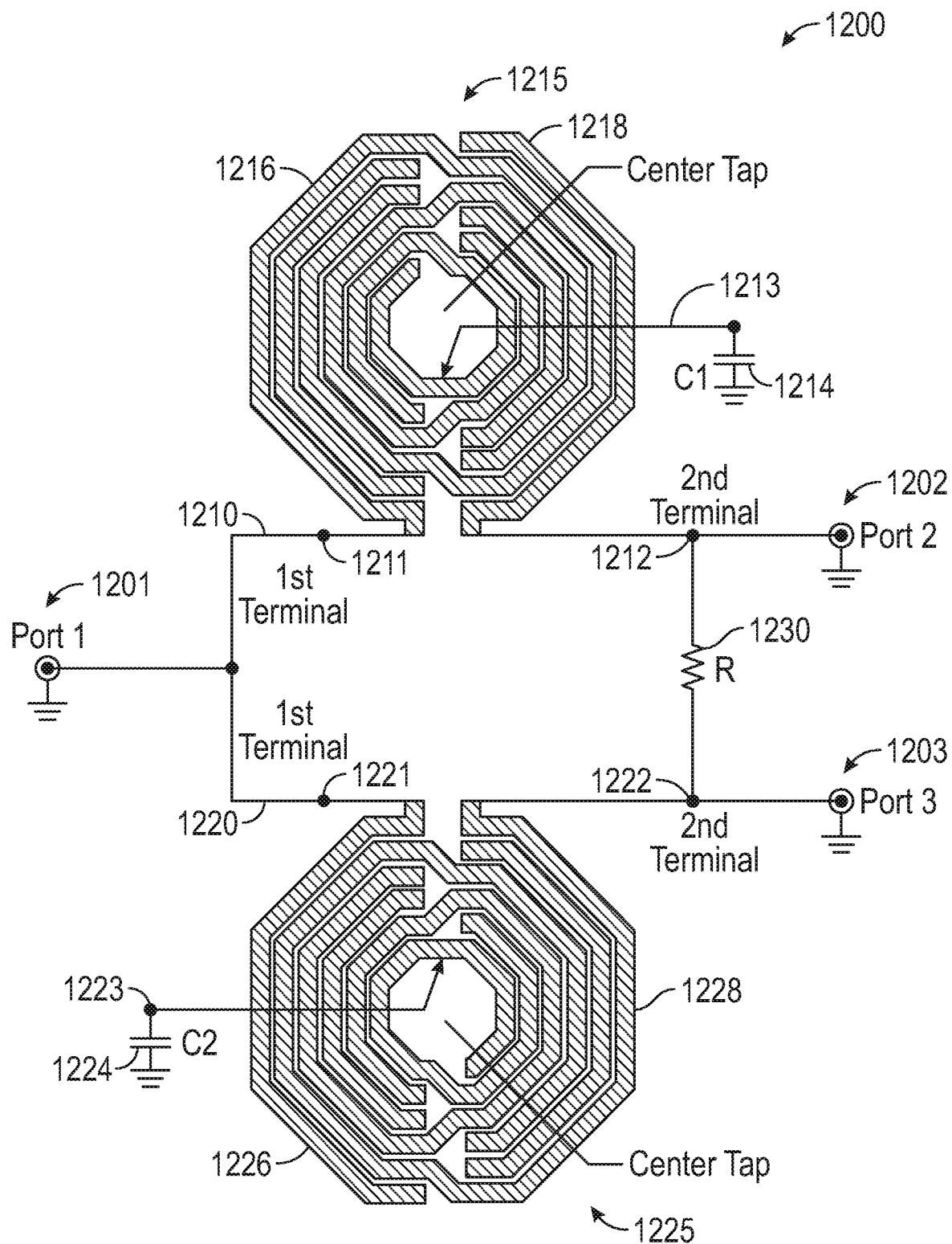
FIG. 12 illustrates a schematic diagram depicting a layout arrangement of the differential inductors of FIG. 11 in accordance with one or more implementations.

FIG. 12 illustrates a schematic diagram depicting a layout arrangement of the differential inductors of FIG. 11 in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The Wilkinson divider/combiner circuit 1200 of FIG. 12 contains components similar to those shown in the Wilkinson divider/combiner circuit 1100 of FIG. 11. The Wilkinson divider/combiner circuit 1200 includes ports 1201-1203, inductors 1216, 1218, 1226 and 1228, capacitors 1214 and 1224, and an isolation resistor 1230. The inductor 1216 interleaves the inductor 1218 in a planar arrangement to form a first differential inductor 1215 along a first signal path 1210. The inductor 1226 interleaves the inductor 1228 in a planar arrangement to form a second differential inductor 1225 along a second signal path 1220. In particular, the port 1202 is coupled to a first terminal 1211 of the inductor 1216 and the port 1202 is coupled to a second terminal 1212 of the inductor 1218. The port 1202 is also coupled to a first terminal 1221 of the inductor 1226 and the port 1203 is coupled to a second terminal 1222 of the inductor 1228. The first capacitor 1214 is coupled to a first center tap node 1213 interposed between the inductors 1216 and 1218, and the second capacitor 1224 is coupled to a second center tap node 1223 interposed between the inductors 1226 and 1228. The isolation resistor 130 is coupled to the first signal path 1210 and the second signal path 1220 to provide isolation between the output ports 1202 and 1203.

Figure 13A:
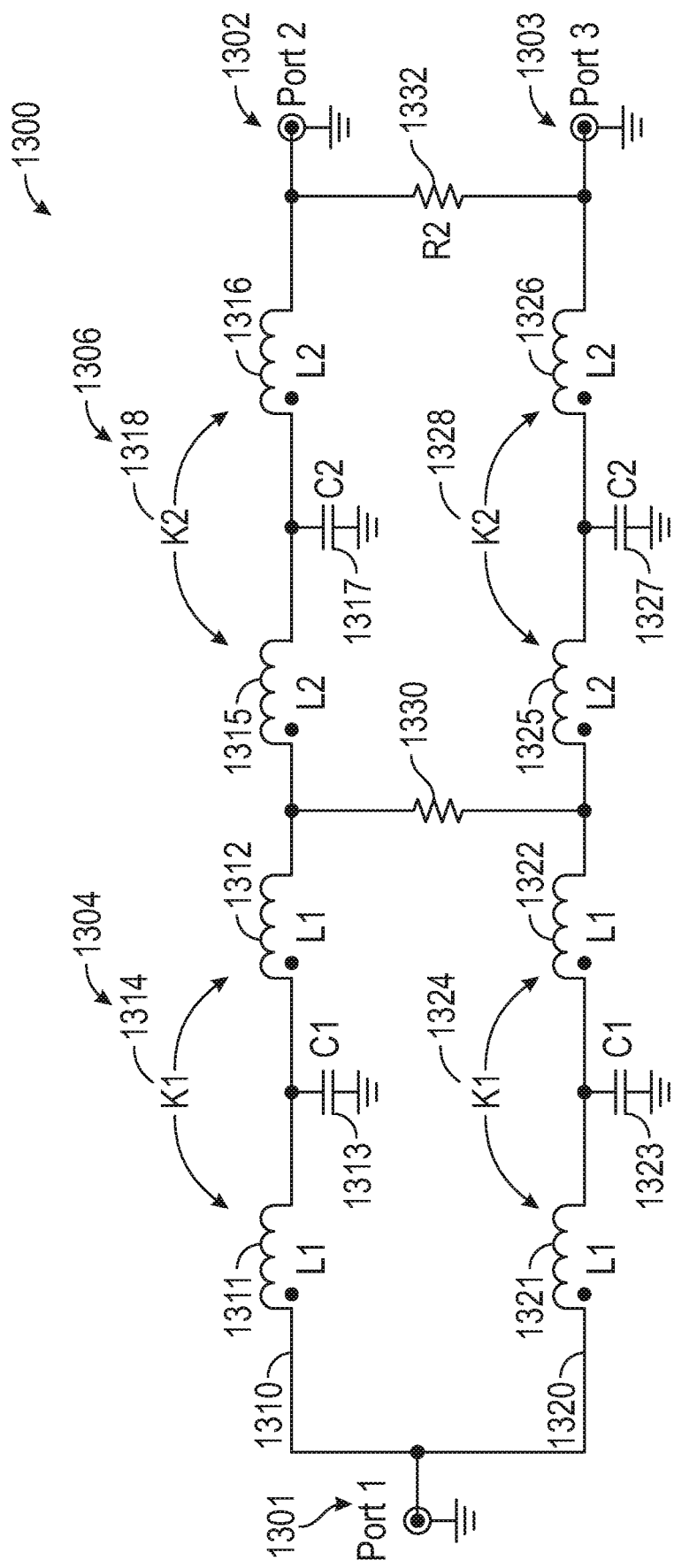
FIG. 13A illustrates a schematic diagram of an example of a multi-stage Wilkinson divider/combiner circuit with magnetically coupled inductors in accordance with one or more implementations.
Figure 13B:
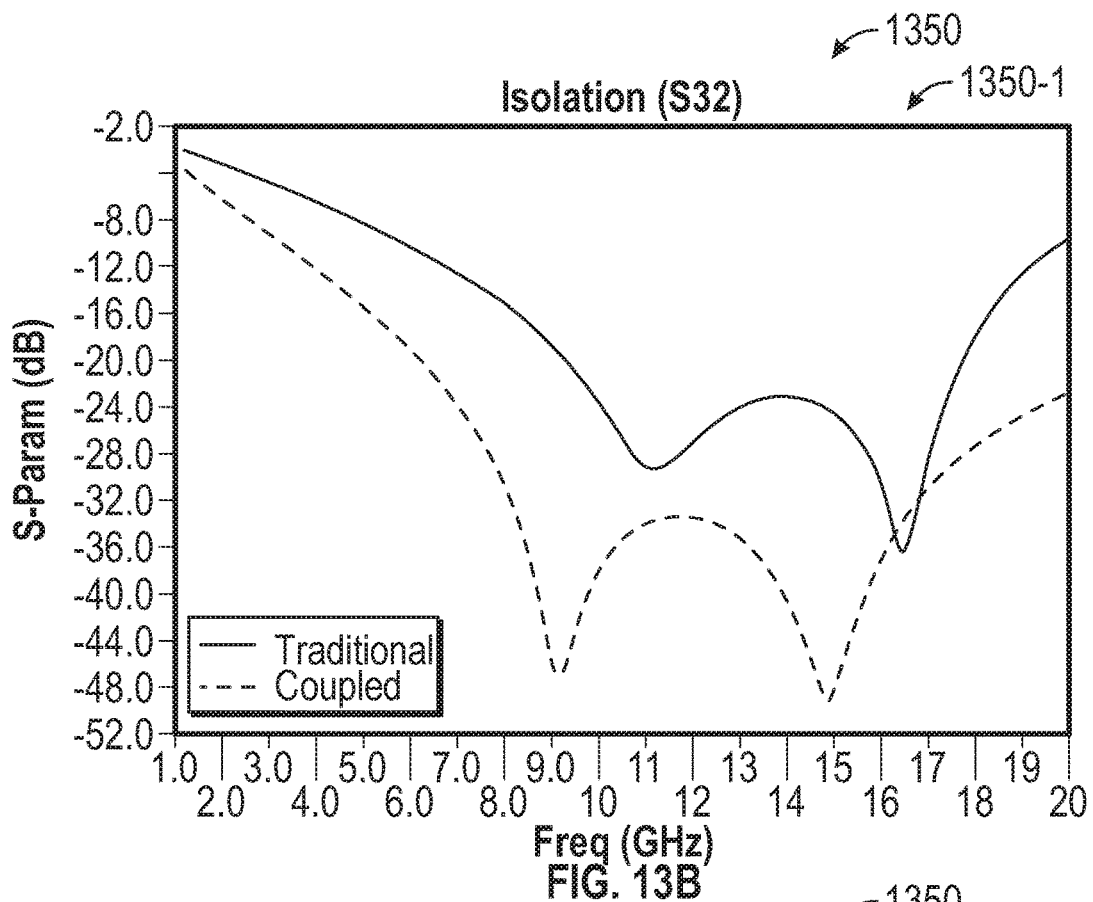
FIGS. 13B to 13E illustrate plots depicting different scattering parameter responses of the traditional multi-stage combiner model compared to the multi-stage Wilkinson divider/combiner circuit with magnetically coupled inductors of FIG. 13A.
Figure 13C:
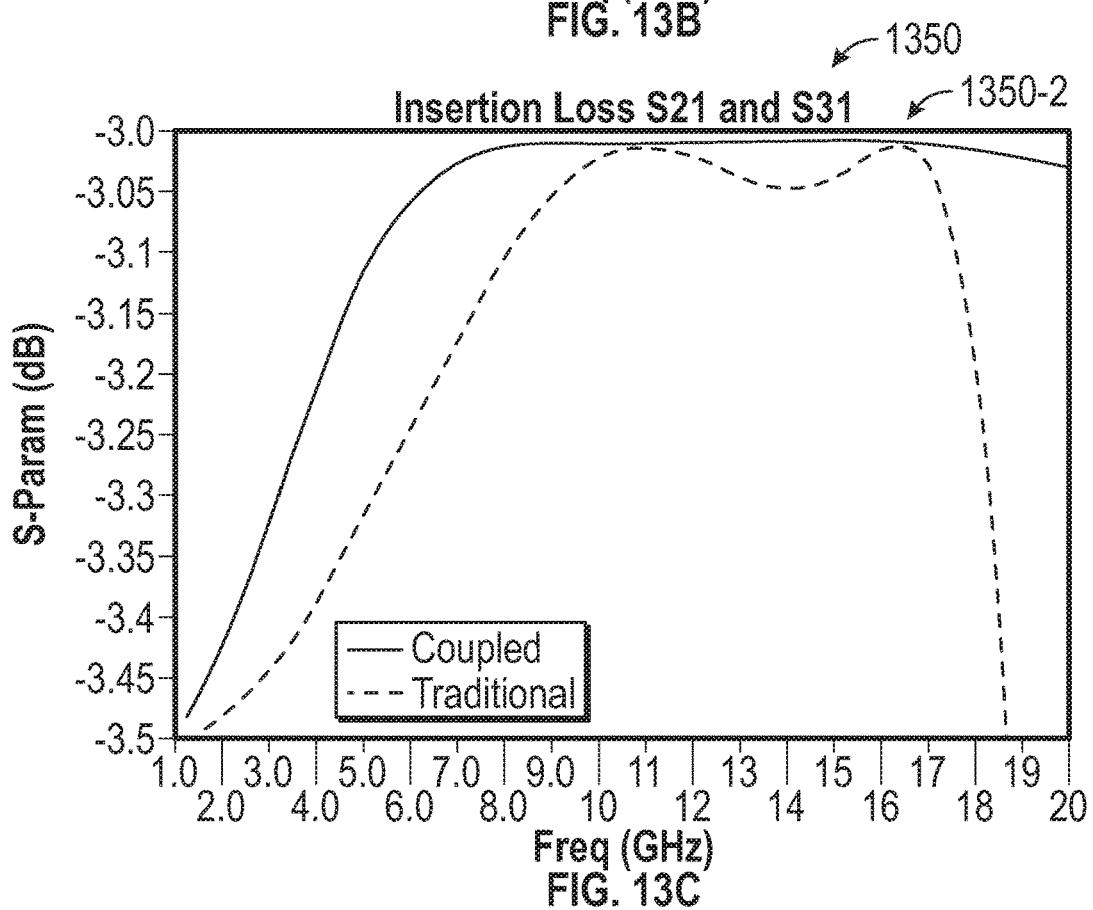
Figure 13D:
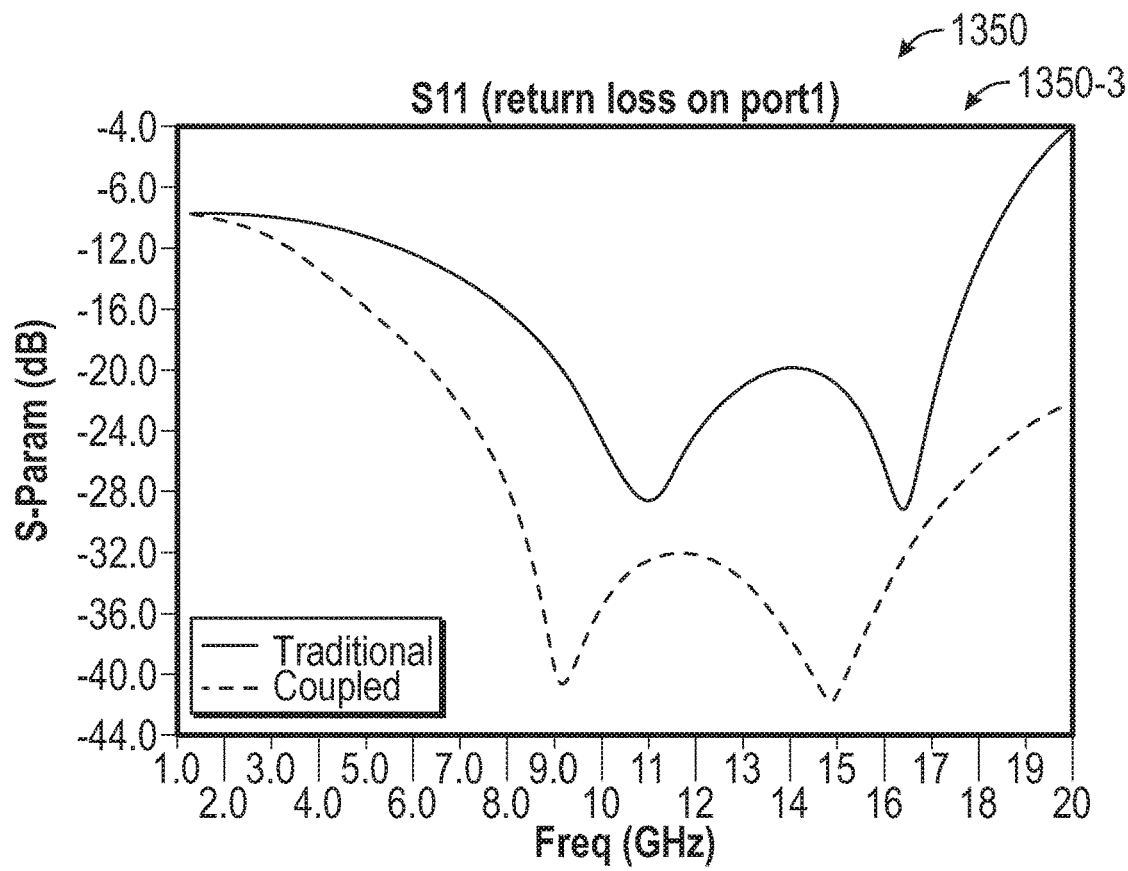
Figure 13E:
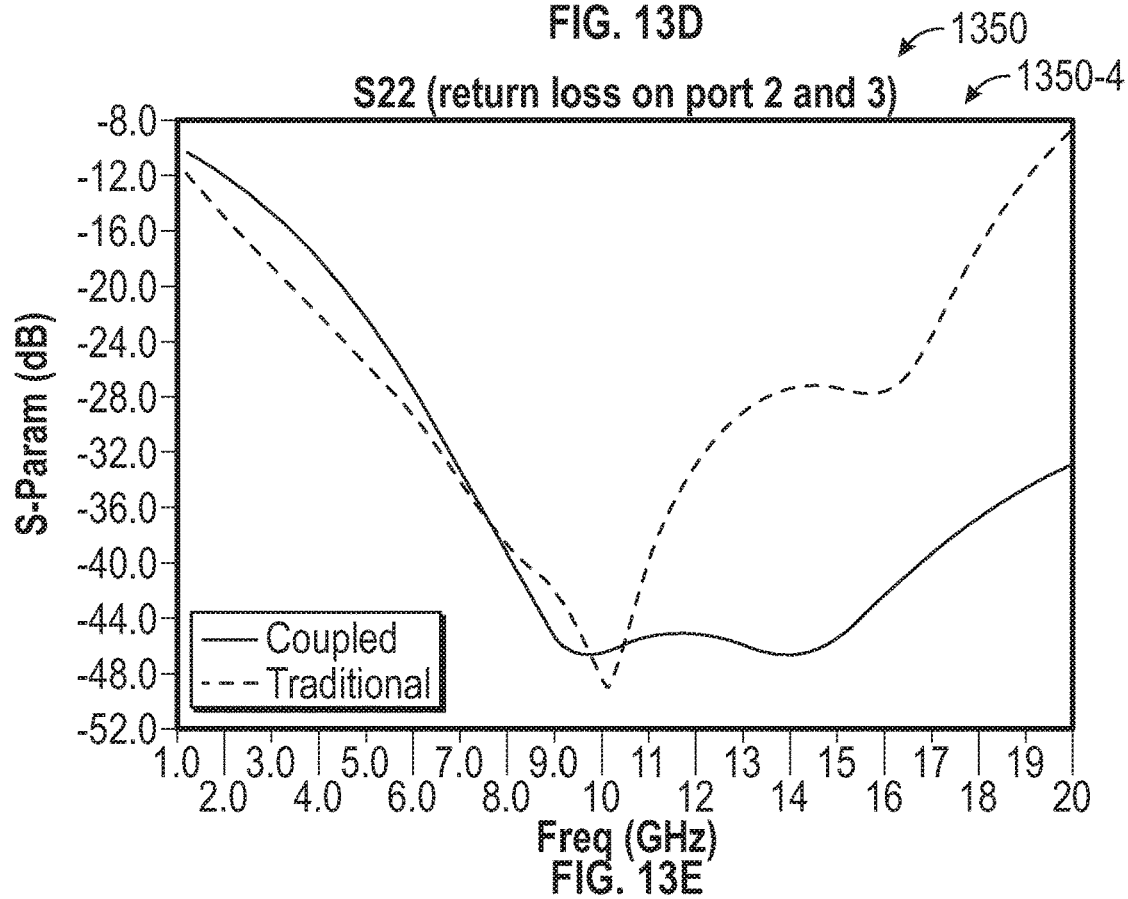

FIG. 13A illustrates a schematic diagram of an example of a multi-stage Wilkinson divider/combiner circuit 1300 with magnetically coupled inductors in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The multi-stage Wilkinson divider/combiner circuit 1300 includes ports 1301-1303, inductors 1311, 1312, 1315, 1316, 1321, 1322, 1325, and 1326, capacitors 1313, 1317, 1323, and 1327, and isolation resistors 1331 and 1332. The multi-stage Wilkinson divider/combiner circuit 1300 includes a first stage 1304 in series with a second stage 1306 between the input port 1301 and the output ports 1302 and 1303. In one or more implementations, the inductors 1311 and 1312 have a coupling coefficient (e.g., K1) that corresponds to that of the inductors 1321 and 1322, and the inductors 1315 and 1316 have a coupling coefficient (e.g., K2) that corresponds to that of the inductors 1325 and 1326. The coupling coefficients K1 and K2 correspond to one another in some implementations, or are different from one another in other implementations.

A first signal path 1310 includes the inductors (e.g., 1311 and 1312) tightly and positively magnetically coupled to one another with a first terminal of the capacitor 1313 interposed between the inductors 1311 and 1312 (where a second terminal of the capacitor 1313 is connected to ground) as part of the first stage 1304. The first signal path 1310 also includes the inductors (e.g., 1315 and 1316) tightly and positively magnetically coupled to one another with a first terminal of the capacitor 1317 interposed between the inductors 1315 and 1316 (where a second terminal of the capacitor 1317 is connected to ground) as part of the second stage 1306.

A second signal path 1320 includes the inductors (e.g., 1321 and 1322) tightly and positively magnetically coupled to one another with a first terminal of the capacitor 1323 interposed between the inductors 1321 and 1322 (where a second terminal of the capacitor 1323 is connected to ground) as part of the first stage 1304. The second signal path 1320 also includes the inductors (e.g., 1325 and 1326) tightly and positively magnetically coupled to one another with a first terminal of the capacitor 1327 interposed between the inductors 1325 and 1326 (where a second terminal of the capacitor 1327 is connected to ground) as part of the second stage 1306. The isolation resistor 1331 is coupled to the first terminals of the inductors 1312 and 1322 to provide isolation between the output ports 1302 and 1303 at an intermediate node between the first stage 1304 and the second stage 1306. The isolation resistor 1332 is coupled to the first terminals of the inductors 1316 and 1326 to provide isolation between the output ports 1302 and 1303 at the output of the second stage 1306.

In one or more implementations, the output port 1303 has a termination impedance that is greater than that of the output port 1302. For example, the output port 1303 may have a termination impedance of 100 ohms compared to a termination impedance of 50 ohms for the output port 1302. In some aspects, the output port 1302 may have a termination impedance that is greater than that of the output port 1303 without departing from the scope of the disclosure.

FIGS. 13B to 13E illustrate plots depicting different scattering parameter responses of the traditional multi-stage combiner model compared to the multi-stage Wilkinson divider/combiner circuit with coupled inductors of FIG. 13A. Each of the plots (e.g., 1350-1, 1350-2, 1350-3, 1350-4) illustrates a first waveform that corresponds to a scattering parameter response of the traditional multi-stage Wilkinson divider/combiner circuit 400 and a second waveform that corresponds to a scattering parameter response of the multi-stage Wilkinson divider/combiner circuit 1300. The plot 1350-1 depicts the isolation at each stage between the output ports (e.g., 1302, 1303). In the plot 1350-1, the second waveform shows a much wider bandwidth than the first waveform at each stage for a gain amplitude at about −35 dB. The plot 1350-2 depicts the insertion loss between the input port (e.g., 1301) and the output port (e.g., 1302). In the plot 1350-2, the second waveform shows a steadier response signal than the first waveform at about −3 dB for all observed frequencies, whereas the first waveform drops sharply at about 17 GHz. The plot 1350-3 depicts the input complex reflection coefficient when a source is placed at the input port (e.g., 1301) and terminating the output port (e.g., 1302). In the plot 1350-3, the second waveform shows a wider bandwidth than the first waveform for a gain amplitude at about −32 dB. The plot 1350-4 depicts the input complex reflection coefficient when a source is placed at the output port (e.g., 1302) and terminating the input port (e.g., 1301). In the plot 1350-4, the second waveform also shows a wider bandwidth than the first waveform at each stage for a gain amplitude at about −44 dB.

Figure 14:
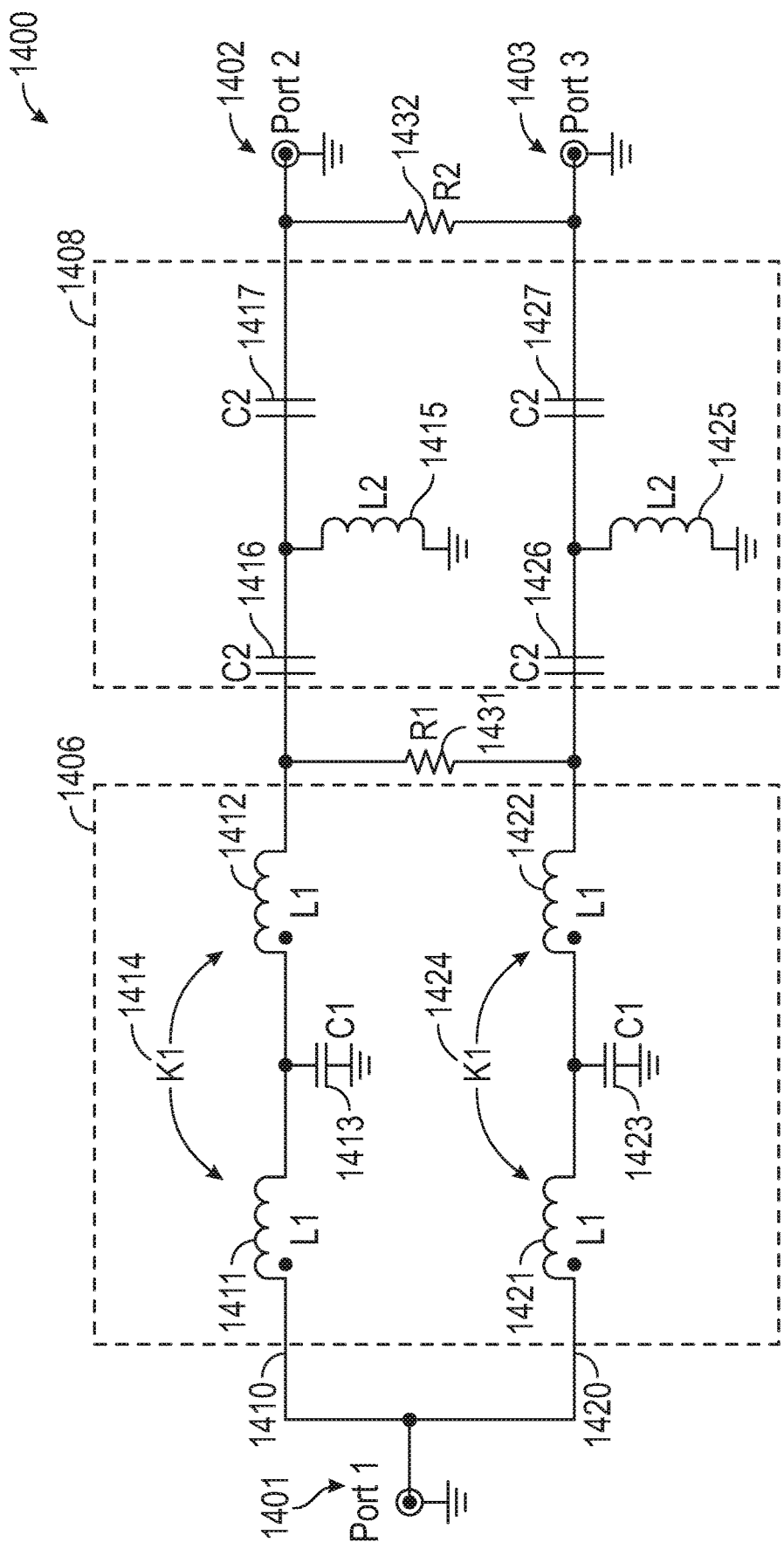
FIG. 14 illustrates a schematic diagram of another example of a multi-stage Wilkinson divider/combiner circuit with magnetically coupled inductors in accordance with one or more implementations.

FIG. 14 illustrates a schematic diagram of another example of a multi-stage Wilkinson divider/combiner circuit 1400 with magnetically coupled inductors in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The multi-stage Wilkinson divider/combiner circuit 1400 includes ports 1401-1403, inductors 1411, 1412, 1415, 1421, 1422, and 1425, capacitors 1413, 1416, 1417, 1423, 1426 and 1427, and isolation resistors 1431 and 1432. The multi-stage Wilkinson divider/combiner circuit 1400 includes a first stage 1406 in series with a second stage 1408 between the input port 1401 and the output ports 1402 and 1403. In one or more implementations, the inductors 1411 and 1412 have a coupling coefficient (e.g., K1) that corresponds to that of the inductors 1421 and 1422.

A first signal path 1410 includes the inductors (e.g., 1411 and 1412) tightly and positively magnetically coupled to one another with a first terminal of the capacitor 1413 interposed between the inductors 1411 and 1412 (where a second terminal of the capacitor 1413 is connected to ground) as part of the first stage 1404. The first signal path 1410 also includes the capacitors (e.g., 1416 and 1417) connected in series with a first terminal of the inductor 1415 interposed between the capacitors 1416 and 1417 (where a second terminal of the inductor 1415 is connected to ground) as part of the second stage 1408.

A second signal path 1420 includes the inductors (e.g., 1421 and 1422) tightly and positively magnetically coupled to one another with a first terminal of the capacitor 1423 interposed between the inductors 1421 and 1422 (where a second terminal of the capacitor 1423 is connected to ground) as part of the first stage 1404. The second signal path 1420 also includes the capacitors (e.g., 1426 and 1427) connected in series with a first terminal of the inductor 1425 interposed between the capacitors 1426 and 1427 (where a second terminal of the inductor 1425 is connected to ground) as part of the second stage 1408. The isolation resistor 1431 is coupled to the first terminals of the inductors 1412 and 1422 to provide isolation between the output ports 1402 and 1403 at an intermediate node between the first stage 1406 and the second stage 1408. The isolation resistor 1432 is coupled to the first terminals of the capacitors 1417 and 1427 to provide isolation between the output ports 1402 and 1403 at the output of the second stage 1408.

Figure 15:
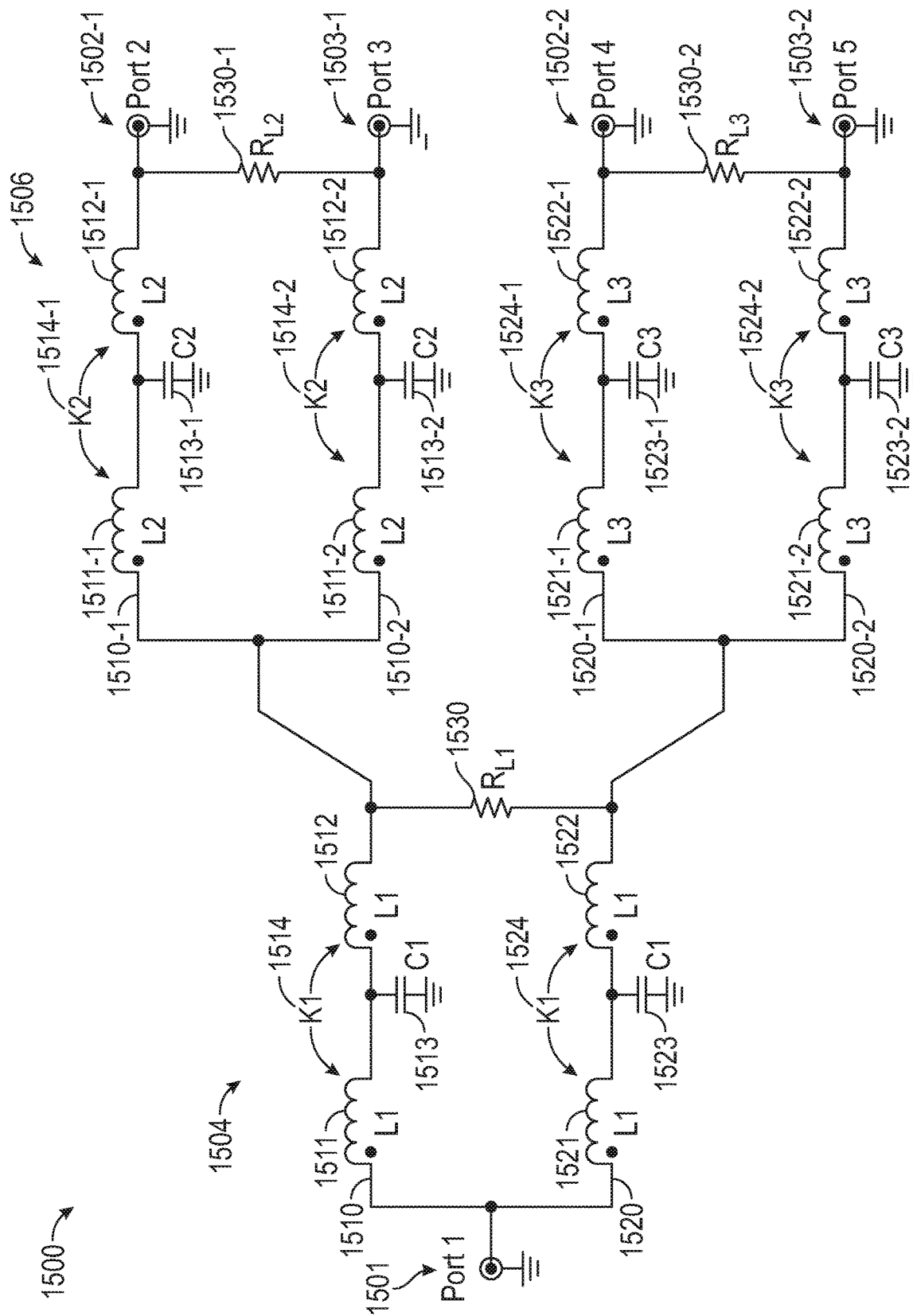
FIG. 15 illustrates a schematic diagram of yet another example of a multi-stage Wilkinson divider/combiner circuit with magnetically coupled inductors and with $2^N$ additional outputs in accordance with one or more implementations.

FIG. 15 illustrates a schematic diagram of yet another example of a multi-stage Wilkinson divider/combiner circuit 1500 with magnetically coupled inductors and with $2^N$ additional outputs where N≥1 in accordance with one or more implementations. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The multi-stage Wilkinson divider/combiner circuit 1500 includes ports 1501, 1502-1, 1502-2, 1503-1 and 1503-2, inductors 1511, 1511-1, 1511-2, 1512, 1512-1, 1521-2, 1521, 1521-1, 1521-2, 1522, 1522-1, and 1522-2, capacitors 1513, 1513-1, 1513-2, 1523, 1523-1 and 1523-2, and isolation resistors 1530, 1530-1 and 1530-2. The multi-stage Wilkinson divider/combiner circuit 1500 includes a first stage 1504 in series with a second stage 1506 between the input port 1501 and the output ports 1502-1, 1502-2, 1503-1 and 1503-2. In one or more implementations, the inductors 1511 and 1512 have a coupling coefficient (e.g., K1) that corresponds to that of the inductors 1521 and 1522. In one or more implementations, the inductors 1511-1 and 1512-1 have a coupling coefficient (e.g., K2) that corresponds to that of the inductors 1511-2 and 1512-2. In one or more implementations, the inductors 1521-1 and 1522-1 have a coupling coefficient (e.g., K3) that corresponds to that of the inductors 1521-2 and 1522-2. The coupling coefficients K1, K2 and K3 correspond to one another in some implementations, or are different from one another in other implementations.

A first signal path 1510 includes the inductors (e.g., 1511 and 1512) tightly and positively magnetically coupled to one another with a first terminal of the capacitor 1513 interposed between the inductors 1511 and 1512 (where a second terminal of the capacitor 1513 is connected to ground) as part of the first stage 1504.

A signal path 1510-1 stemming from the first signal path 1510 includes the inductors (e.g., 1511-1 and 1512-1) tightly and positively magnetically coupled to one another with a first terminal of the capacitor 1513-1 interposed between the inductors 1511-1 and 1512-1 (where a second terminal of the capacitor 1513-1 is connected to ground) as part of the second stage 1506. A signal path 1510-2 also stemming from the first signal path 1510 includes the inductors (e.g., 1511-2 and 1512-2) tightly and positively magnetically coupled to one another with a first terminal of the capacitor 1513-2 interposed between the inductors 1511-2 and 1512-2 (where a second terminal of the capacitor 1513-2 is connected to ground) as part of the second stage 1506.

A second signal path 1520 includes the inductors (e.g., 1521 and 1522) tightly and positively magnetically coupled to one another with a first terminal of the capacitor 1523 interposed between the inductors 1521 and 1522 (where a second terminal of the capacitor 1523 is connected to ground) as part of the first stage 1504.

A signal path 1520-1 stemming from the first signal path 1520 includes the inductors (e.g., 1521-1 and 1522-1) tightly and positively magnetically coupled to one another with a first terminal of the capacitor 1523-1 interposed between the inductors 1521-1 and 1522-1 (where a second terminal of the capacitor 1523-1 is connected to ground) as part of the second stage 1506. A signal path 1520-2 also stemming from the first signal path 1520 includes the inductors (e.g., 1521-2 and 1522-2) tightly and positively magnetically coupled to one another with a first terminal of the capacitor 1523-2 interposed between the inductors 1521-2 and 1522-2 (where a second terminal of the capacitor 1523-2 is connected to ground) as part of the second stage 1506.

The isolation resistor 1530 is coupled to the first terminals of the inductors 1512 and 1522 to provide isolation between the output ports 1502-1, 1502-2, 1503-1 and 1503-2 at an intermediate node between the first stage 1504 and the second stage 1506. The isolation resistor 1530-1 is coupled to the first terminals of the inductors 1512-1 and 1512-2 to provide isolation between the output ports 1502-1 and 1503-1. The isolation resistor 1530-2 is coupled to the first terminals of the inductors 1522-1 and 1522-2 to provide isolation between the output ports 1502-2 and 1503-2.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A circuit for facilitating signal splitting and recombination with a wider frequency bandwidth, comprising:

a first coupled inductor circuit coupled to an input terminal and providing a first signal path between the input terminal and a first output terminal, the first coupled inductor circuit comprising a first plurality of inductors that are positively magnetically coupled to one another;
a second coupled inductor circuit coupled to the input terminal and providing a second signal path between the input terminal and a second output terminal, the second coupled inductor circuit comprising a second plurality of inductors that are positively magnetically coupled to one another; and
an isolation circuit coupled to the first output terminal and the second output terminal, the isolation circuit providing isolation between the first output terminal and the second output terminal;
wherein the first coupled inductor circuit is associated with a first coupling coefficient and the second coupled inductor circuit is associated with a second coupling coefficient, and wherein each of the first coupling coefficient and the second coupling coefficient having a value greater than zero and lesser than unity.

2. The circuit of claim 1, wherein the first plurality of inductors is connected in series with a first terminal of a first capacitor, the first terminal of the first capacitor being connected to common terminals of each of the first plurality of inductors, the first capacitor having a second terminal connected to ground, and wherein the second plurality of inductors is connected in series with a first terminal of a second capacitor, the first terminal of the second capacitor being connected to common terminals of each of the second plurality of inductors, the second capacitor having a second terminal connected to ground.

3. The circuit of claim 1, wherein the first plurality of inductors has a current direction that corresponds to that of the second plurality of inductors.

4. The circuit of claim 1, wherein each of the first coupling coefficient and the second coupling coefficient have values from a range between 0.7 and unity.

5. The circuit of claim 4, wherein the first coupled inductor circuit and the second coupled inductor circuit are each configured to provide respective output signals to the first output terminal and the second output terminal based on a transfer function, wherein the transfer function is a function of the first and second coupling coefficients, an impedance of the isolation circuit, inductances of the first and second plurality of inductors, capacitances associated with the first and second coupled inductor circuits, and a radial frequency associated with the first and second coupled inductor circuits.

6. The circuit of claim 5, wherein the transfer function is defined as $$S = \frac{j \cdot R_L \cdot (1 + \omega^2 \cdot K \cdot L \cdot C)}{\omega^3 \cdot L^2 \cdot C \cdot (K^2 - 1) + 2 \cdot \omega \cdot L \cdot (K + 1) + j \cdot R_L \cdot (\omega^2 \cdot L \cdot C - 1)},$$

where $\omega$ is a radial frequency associated with the first coupled inductor circuit and the second coupled inductor circuit, $R^L$ is an impedance of the isolation circuit, K is a coupling coefficient, L is an inductance of each of the first coupled inductor circuit and the second coupled inductor circuit, C is a capacitance associated with the first coupled inductor circuit and the second coupled inductor circuit, and j is an imaginary value.

7. The circuit of claim 1, wherein an impedance of the first coupled inductor circuit and the second coupled inductor circuit corresponds to an impedance equivalent to that of a quarter-wavelength impedance transformer.

8. The circuit of claim 1, wherein the second output terminal has a termination impedance that is greater than that of the first output terminal.

9. An electronic device for facilitating signal splitting and recombination with a wider frequency bandwidth, comprising:
a first coupled inductor circuit coupled to a first port and a second port on a first transmission line;
a second coupled inductor circuit coupled to the first port and a third port on a second transmission line; and
wherein each of the first coupled inductor circuit and the second coupled inductor circuit comprises at least one pair of positively magnetically coupled inductors in series, wherein the second port and the third port are isolated from one another;
wherein the first coupled inductor circuit comprises a first inductor, a second inductor and a first capacitor, the first capacitor being coupled to a first node between the first inductor and the second inductor and to ground, the first inductor having an inductance that corresponds to that of the second inductor; and
wherein the second coupled inductor circuit comprises a third inductor, a fourth inductor and a second capacitor, the second capacitor being coupled to a second node between the third inductor and the fourth inductor and to ground, the third inductor having an inductance that corresponds to that of the fourth inductor.

10. The electronic device of claim 9, wherein the first coupled inductor circuit has an inductance that corresponds to that of the second coupled inductor circuit, and wherein the first capacitor has a capacitance that corresponds to that of the second capacitor.

11. The electronic device of claim 9, wherein the first coupled inductor circuit comprises a third capacitor coupled in series with the first port and the second port, the third capacitor being coupled in parallel to the first inductor and the second inductor, and wherein the second coupled inductor circuit comprises a fourth capacitor coupled in series with the first port and the third port, the fourth capacitor being coupled in parallel to the third inductor and the fourth inductor.

12. The electronic device of claim 11, wherein the first coupled inductor circuit comprises a fifth capacitor and a sixth capacitor, the fifth capacitor being coupled to the first port and the first inductor and the sixth capacitor being coupled to the second port and the second inductor, and wherein the second coupled inductor circuit comprises a seventh capacitor and an eighth capacitor, the seventh capacitor being coupled to the first port and the third inductor and the eighth capacitor being coupled to the third port and the fourth inductor.

13. The electronic device of claim 9, wherein the first coupled inductor circuit is a first differential inductor and the second coupled inductor circuit is a second differential inductor, wherein the first port is coupled to a first terminal of the first differential inductor and a first terminal of the second differential inductor, wherein the second port is coupled to a second terminal of the first differential inductor and the third port is coupled to a second terminal of the second differential inductor, wherein the first inductor interleaves the second inductor in a planar arrangement to form the first differential inductor and the third inductor interleaves the fourth inductor in a planar arrangement to form the second differential inductor, and wherein the first capacitor is coupled to a first center tap node interposed between the first inductor and the second inductor and the second capacitor is coupled to a second center tap node interposed between the third inductor and the fourth inductor.

14. The electronic device of claim 9, wherein the first inductor is coupled in series with the second inductor, and wherein the third inductor is coupled in series with the fourth inductor.

15. The electronic device of claim 14, wherein the first inductor and the second inductor have a coupling coefficient that corresponds to that of the third inductor and the fourth inductor.

16. The electronic device of claim 9, wherein the first coupled inductor circuit is associated with a first coupling coefficient and the second coupled inductor circuit is associated with a second coupling coefficient, and wherein each of the first coupling coefficient and the second coupling coefficient having a value greater than zero and lesser than unity.

17. A system for facilitating signal splitting and recombination with a wider frequency bandwidth, comprising:
   a plurality of coupled inductor circuits connected to an input terminal and providing a plurality of signal paths between the input terminal and a plurality of output terminals, wherein each of the plurality of coupled inductor circuits comprises at least two inductors positively magnetically coupled to one another and associated with different signal paths;
   a first isolation resistor interposed between two of the plurality of coupled inductor circuits; and
   a second isolation resistor connected to the plurality of output terminals,
   wherein each of the plurality of coupled inductor circuits is configured to provide an output signal to a respective one of the plurality of output terminals; and
   wherein respective coupled inductor circuits amongst the plurality of coupled inductor circuits are each associated with a respective coupling coefficient, each of the respective coupling coefficients having a value greater than zero and lesser than unity.

18. The system of claim 17, wherein the plurality of signal paths comprises:
   a first stage coupled to the input terminal and the plurality of output terminals, the first stage comprising a first coupled inductor circuit of the plurality of coupled inductor circuits coupled to the input terminal and a first output terminal of the plurality of output terminals on a first signal path of the plurality of signal paths, the first stage comprising a second coupled inductor circuit of the plurality of coupled inductor circuits coupled to the input terminal and a second output terminal of the plurality of output terminals on a second signal path of the plurality of signal paths, the first stage comprising the first isolation resistor coupled to the first signal path and the second signal path; and
   a second stage coupled to the first isolation resistor and the plurality of output terminals on the plurality of signal paths, the second stage comprising a third coupled inductor circuit of the plurality of coupled inductor circuits coupled to the first isolation resistor and the first output terminal on the first signal path, the second stage comprising a fourth coupled inductor circuit of the plurality of coupled inductor circuits coupled to the first isolation resistor and the second output terminal on the second signal path, and the second stage comprising the second isolation resistor coupled between the first output terminal and the second output terminal.

19. The system of claim 18, wherein the second stage comprises a fifth coupled inductor circuit of the plurality of coupled inductor circuits and a sixth coupled inductor circuit of the plurality of coupled inductor circuits, the fifth coupled inductor circuit being coupled to the first isolation resistor and a third output terminal of the plurality of output terminals on a third signal path of the plurality of signal paths, the sixth coupled inductor circuit being coupled to the first isolation resistor and a fourth output terminal of the plurality of output terminals on a fourth signal path of the plurality of signal paths, wherein the second isolation resistor is coupled between the first output terminal and the third output terminal, and the second stage comprising a third isolation resistor coupled between the second output terminal and the fourth output terminal.

20. The system of claim 17, wherein each of the respective coupling coefficients has a value from a range between 0.7 and unity.

* * * * *